(12) United States Patent
Todorokihara

(10) Patent No.: US 10,886,934 B2
(45) Date of Patent: Jan. 5, 2021

(54) TIME TO DIGITAL CONVERTER AND A/D CONVERSION CIRCUIT

(71) Applicant: Seiko Epson Corporation, Tokyo (JP)

(72) Inventor: Masayoshi Todorokihara, Suwa (JP)

(73) Assignee: Seiko Epson Corporation

(*) Notice: Subject to any disclaimer, the term of this patent is extended or adjusted under 35 U.S.C. 154(b) by 0 days.

(21) Appl. No.: 16/847,755

(22) Filed: Apr. 14, 2020

(65) Prior Publication Data

US 2020/0328755 A1    Oct. 15, 2020

(30) Foreign Application Priority Data

Apr. 15, 2019    (JP) ................................. 2019-076941

(51) Int. Cl.
   *H03M 1/50*    (2006.01)
   *G04F 10/00*   (2006.01)
   *H03M 1/12*    (2006.01)

(52) U.S. Cl.
   CPC ............ *H03M 1/50* (2013.01); *G04F 10/005* (2013.01); *H03M 1/1245* (2013.01)

(58) Field of Classification Search
   CPC ...... H03M 1/50; H03M 1/1245; G04F 10/005
   USPC ................................. 341/122, 155, 157, 166
   See application file for complete search history.

(56) References Cited

U.S. PATENT DOCUMENTS

| | | | |
|---|---|---|---|
| 5,684,760 A | 11/1997 | Hunter | |
| 8,174,293 B2* | 5/2012 | Yoshihara | G04F 10/005 |
| | | | 327/107 |
| 8,797,203 B2* | 8/2014 | Lee | G04F 10/005 |
| | | | 341/166 |
| 2010/0237923 A1 | 9/2010 | Terazawa et al. | |

FOREIGN PATENT DOCUMENTS

| | | |
|---|---|---|
| JP | H08-297177 A | 11/1996 |
| JP | 2012-049659 A | 3/2012 |
| JP | 5201041 B2 | 6/2013 |

\* cited by examiner

*Primary Examiner* — Khai M Nguyen
(74) *Attorney, Agent, or Firm* — Harness, Dickey & Pierce, P.L.C.

(57) ABSTRACT

A time to digital converter includes a state transition section configured to start, based on a trigger signal, state transition in which an internal state transitions, a transition-state acquiring section configured to acquire, in synchronization with a reference signal, state information from the state transition section and hold the state information, and an arithmetic operation section configured to calculate, based on the state information, a time digital value corresponding to the number of times of transition of the internal state. The state transition section includes a tapped delay line to which a plurality of delay elements are coupled, a logic circuit, and a state machine. The state information is represented by count information output from the state machine and propagation information output from the tapped delay line. A hamming distance of the state information before and after the state transition is 1. A time from when the internal state transitions from a first internal state to a second internal state until when the internal state reverts to the first internal state is longer than a time interval for updating the state information held by the transition-state acquiring section.

7 Claims, 12 Drawing Sheets

FIG. 4

| EN | q1 | q0 | LUTa<br>D0 |
|---|---|---|---|
| 0 | 0 | 0 | D0 |
| 0 | 0 | 1 | 0 |
| 0 | 1 | 0 | 0 |
| 0 | 1 | 1 | D0 |
| 1 | 0 | 0 | 1 |
| 1 | 0 | 1 | 0 |
| 1 | 1 | 0 | 0 |
| 1 | 1 | 1 | 1 |

FIG. 5

| D6 | q1 | q0 | LUTb<br>q1 | LUTc<br>q0 |
|---|---|---|---|---|
| 0 | 0 | 0 | 0 | 0 |
| 0 | 0 | 1 | 1 | 1 |
| 0 | 1 | 0 | 0 | 0 |
| 0 | 1 | 1 | 1 | 1 |
| 1 | 0 | 0 | 0 | 1 |
| 1 | 0 | 1 | 0 | 1 |
| 1 | 1 | 0 | 1 | 0 |
| 1 | 1 | 1 | 1 | 0 |

FIG. 6

| STATE | D[6:0] (S[6:0]) ||||||| q[1:0] (Q[1:0]) ||
| --- | --- | --- | --- | --- | --- | --- | --- | --- | --- |
|  | D6 (S6) | D5 (S5) | D4 (S4) | D3 (S3) | D2 (S2) | D1 (S1) | D0 (S0) | q1 (Q1) | q0 (Q0) |
| 0  | 0 | 0 | 0 | 0 | 0 | 0 | 0 | 0 | 0 |
| 1  | 0 | 0 | 0 | 0 | 0 | 0 | 1 | 0 | 0 |
| 2  | 0 | 0 | 0 | 0 | 0 | 1 | 1 | 0 | 0 |
| 3  | 0 | 0 | 0 | 0 | 1 | 1 | 1 | 0 | 0 |
| 4  | 0 | 0 | 0 | 1 | 1 | 1 | 1 | 0 | 0 |
| 5  | 0 | 0 | 1 | 1 | 1 | 1 | 1 | 0 | 0 |
| 6  | 0 | 1 | 1 | 1 | 1 | 1 | 1 | 0 | 0 |
| 7  | 1 | 1 | 1 | 1 | 1 | 1 | 1 | 0 | 0 |
| 8  | 1 | 1 | 1 | 1 | 1 | 1 | 1 | 0 | 1 |
| 9  | 1 | 1 | 1 | 1 | 1 | 1 | 0 | 0 | 1 |
| 10 | 1 | 1 | 1 | 1 | 1 | 0 | 0 | 0 | 1 |
| 11 | 1 | 1 | 1 | 1 | 0 | 0 | 0 | 0 | 1 |
| 12 | 1 | 1 | 1 | 0 | 0 | 0 | 0 | 0 | 1 |
| 13 | 1 | 1 | 0 | 0 | 0 | 0 | 0 | 0 | 1 |
| 14 | 1 | 0 | 0 | 0 | 0 | 0 | 0 | 0 | 1 |
| 15 | 0 | 0 | 0 | 0 | 0 | 0 | 0 | 0 | 1 |
| 16 | 0 | 0 | 0 | 0 | 0 | 0 | 0 | 1 | 1 |
| 17 | 0 | 0 | 0 | 0 | 0 | 0 | 1 | 1 | 1 |
| 18 | 0 | 0 | 0 | 0 | 0 | 1 | 1 | 1 | 1 |
| 19 | 0 | 0 | 0 | 0 | 1 | 1 | 1 | 1 | 1 |
| 20 | 0 | 0 | 0 | 1 | 1 | 1 | 1 | 1 | 1 |
| 21 | 0 | 0 | 1 | 1 | 1 | 1 | 1 | 1 | 1 |
| 22 | 0 | 1 | 1 | 1 | 1 | 1 | 1 | 1 | 1 |
| 23 | 1 | 1 | 1 | 1 | 1 | 1 | 1 | 1 | 1 |
| 24 | 1 | 1 | 1 | 1 | 1 | 1 | 1 | 1 | 0 |
| 25 | 1 | 1 | 1 | 1 | 1 | 1 | 0 | 1 | 0 |
| 26 | 1 | 1 | 1 | 1 | 1 | 0 | 0 | 1 | 0 |
| 27 | 1 | 1 | 1 | 1 | 0 | 0 | 0 | 1 | 0 |
| 28 | 1 | 1 | 1 | 0 | 0 | 0 | 0 | 1 | 0 |
| 29 | 1 | 1 | 0 | 0 | 0 | 0 | 0 | 1 | 0 |
| 30 | 1 | 0 | 0 | 0 | 0 | 0 | 0 | 1 | 0 |
| 31 | 0 | 0 | 0 | 0 | 0 | 0 | 0 | 1 | 0 |

FIG. 7

| COUNT VALUE [Dec] | q[1:0] (Q[1:0]) ||
| --- | --- | --- |
|  | q1 (Q1) | q0 (Q0) |
| 0 | 0 | 0 |
| 1 | 0 | 1 |
| 2 | 1 | 1 |
| 3 | 1 | 0 |

| INTERNAL STATE (6bit) | FREQUENCY [COUNT] | BIN SIZE [psec] | CUMULATIVE BIN SIZE [psec] | BIN REPRESENTATIVE VALUE [psec] | CORRECTED NUMBER OF TIMES OF TRANSITION (9bit) |
|---|---|---|---|---|---|
| 0 | 1496 | 779 | 779 | 390 | 8 |
| 1 | 1214 | 632 | 1412 | 1095 | 22 |
| 2 | 292 | 152 | 1564 | 1488 | 30 |
| 3 | 345 | 180 | 1743 | 1653 | 34 |
| 4 | 348 | 181 | 1925 | 1834 | 37 |
| 5 | 288 | 150 | 2075 | 2000 | 41 |
| 6 | 279 | 145 | 2220 | 2147 | 44 |
| 7 | 1615 | 841 | 3061 | 2641 | 54 |
| 8 | 1496 | 779 | 3840 | 3451 | 71 |
| 9 | 1188 | 619 | 4459 | 4150 | 85 |
| 10 | 393 | 205 | 4664 | 4561 | 94 |
| 11 | 357 | 186 | 4850 | 4757 | 98 |
| 12 | 353 | 184 | 5034 | 4942 | 102 |
| 13 | 352 | 183 | 5217 | 5125 | 105 |
| 14 | 359 | 187 | 5404 | 5310 | 109 |
| 15 | 1628 | 848 | 6252 | 5828 | 120 |
| 16 | 1311 | 683 | 6935 | 6593 | 136 |
| 17 | 1230 | 641 | 7575 | 7255 | 149 |

TIME TO DIGITAL CONVERTER AND A/D CONVERSION CIRCUIT

The present application is based on, and claims priority from JP Application Serial Number 2019-076941, filed Apr. 15, 2019, the disclosure of which is hereby incorporated by reference herein in its entirety.

BACKGROUND

1. Technical Field

The present disclosure relates to a time to digital converter and an A/D conversion circuit.

2. Related Art

JP A-8-297177 (Patent Literature 1) discloses a time interval measurement circuit (a time to digital converter) to which an input pulse signal representing a time interval to be measured is supplied and in which a state of a ring oscillator is latched at an end of the supplied pulse signal, a "coarse" value for the length of the measured time interval is obtained from a count value recorded by a high-frequency counter, and a "fine" value in a cycle fraction of the ring oscillator is obtained from a latched value. The time interval measurement circuit combines the "coarse" value and the "fine" value to acquire a transition state of the ring oscillator.

However, in the time interval measurement circuit described in Patent Literature 1, the high-frequency counter for acquiring the "coarse" value for the length of the measured time interval and the ring oscillator for obtaining the "fine" value in the cycle fraction of the ring oscillator independently operate. Accordingly, because of fluctuations in the acquisition timing of the count values output from the high-frequency counter and the oscillation of the ring oscillator, wrong state information (transition state) is likely to be acquired at a timing for acquiring a transition state. Therefore, there is room of improvement.

SUMMARY

A time to digital converter according to an aspect of the present disclosure is a time to digital converter to which a reference signal and a trigger signal are input, the time to digital converter outputting a time digital value corresponding to a time event of the trigger signal, the time to digital converter including: a state transition section configured to output state information indicating an internal state and to start, based on the trigger signal, state transition in which the internal state transitions; a transition-state acquiring section configured to acquire, in synchronization with the reference signal, the state information from the state transition section and to hold the state information; and an arithmetic operation section configured to calculate, based on the state information, the time digital value corresponding to a number of times of transition of the internal state. The state transition section includes a tapped delay line to which a plurality of delay elements are coupled, a logic circuit, and a state machine. The state information is represented by count information output from the state machine and propagation information output from the tapped delay line. A hamming distance of the state information before and after the state transition is 1. A time from when the internal state transitions from a first internal state to a second internal state until when the internal state reverts to the first internal state is longer than a time interval for updating the state information held by the transition-state acquiring section.

In the time to digital converter according to the aspect, the state transition section may stop the state transition when the number of times of transition exceeds a number of times based on an upper limit value.

In the time to digital converter according to the aspect, the arithmetic operation section may calculate a number of times of state transition based on the state information, weight the number of times of state transition based on elapse of time, and integrate the weighted number of times of state transition to calculate and output the time digital value.

In the time to digital converter according to the aspect, the arithmetic operation section may correct the number of times of state transition using a delay amount of each of the plurality of delay elements.

In the time to digital converter according to the aspect, a plurality of the trigger signals may be input, and the arithmetic operation section may generate the time digital value from a difference between a first time digital value corresponding to a time event of a first trigger signal among the plurality of trigger signals and a second time digital value corresponding to a time event of a second trigger signal among the plurality of trigger signals.

An A/D conversion circuit according to an aspect of the present disclosure is an A/D conversion circuit that converts an input analog signal into a digital signal and outputs the digital signal, the A/D conversion circuit including: the time to digital converter according to the aspect; a reference-waveform-signal generation circuit configured to generate a reference waveform signal based on the reference signal; and a comparator configured to compare a voltage of the analog signal and a voltage of the reference waveform signal and output the trigger signal. The A/D conversion circuit outputs the digital signal based on the time digital value generated by the time to digital converter.

An A/D conversion circuit according to an aspect of the present disclosure is an A/D conversion circuit that converts an input analog signal into a digital signal and outputs the digital signal, the A/D conversion circuit including: the time to digital converter according to the aspect; a sample hold circuit configured to sample and hold a voltage of the analog signal; a reference-waveform-signal generation circuit configured to generate a reference waveform signal based on the reference signal; and a comparator configured to compare the voltage held by the sample hold circuit and a voltage of the reference waveform signal and output the trigger signal. The A/D conversion circuit outputs the digital signal based on the time digital value generated by the time to digital converter.

BRIEF DESCRIPTION OF THE DRAWINGS

FIG. 4 is a diagram showing an example of a truth table of an LUT.

FIG. 5 is a diagram showing an example of a truth table of LUTs.

FIG. 6 is a diagram showing an example of propagation information and count information.

FIG. 7 is a diagram showing a relation between count values included in the count information and the number of times of propagation of a tapped delay line.

DESCRIPTION OF EXEMPLARY EMBODIMENTS

Preferred embodiments of the present disclosure are explained below with reference to the drawings. The drawings are referred to for convenience of explanation. The embodiments explained below do not unduly limit the content of the present disclosure described in the appended claims. Not all of components explained below are essential constituent elements of the present disclosure.

In the following explanation, logical levels of signals being at a high level is sometimes simply referred to as "H level" or "1" and the logical levels of the signals being at a low level is sometimes simply referred to as "L level" or "0".

1. Configuration of a Time to Digital Converter

1.1 First Embodiment

Configuration of a Time to Digital Converter

Figure 1:
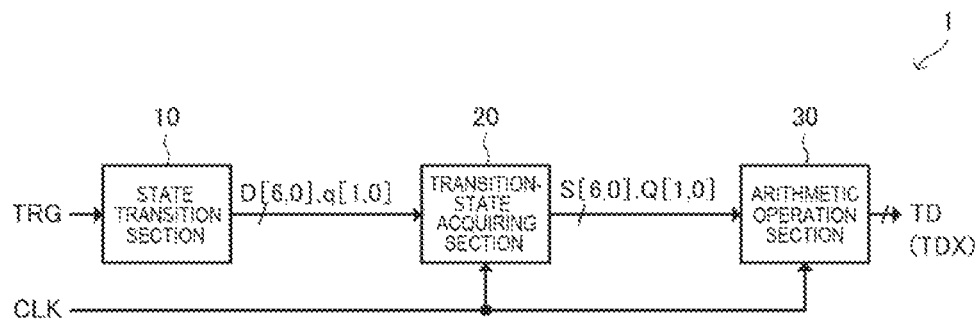
FIG. 1 is a block diagram showing a configuration example of a time to digital converter in a first embodiment.

FIG. 1 is a block diagram showing a configuration example of a time to digital converter 1 in a first embodiment. As shown in FIG. 1, the time to digital converter 1 includes a state transition section 10, a transition-state acquiring section 20, and an arithmetic operation section 30. A reference clock signal CLK and a trigger signal TRG are input to the time to digital converter 1. The time to digital converter 1 generates and outputs a time digital value TD or a time digital value TDX corresponding to a time event of the trigger signal TRG with respect to the reference clock signal CLK. The reference clock signal CLK is an example of a reference signal.

The trigger signal TRG is input to the state transition section 10. An internal state of the state transition section 10 transitions based on a logical level of the trigger signal TRG input to the state transition section 10. In other words, the state transition section starts, based on the trigger signal TRG, a state transition in which the internal state transitions. The state transition section 10 outputs propagation information D and count information q as state information indicating the internal state. In the time to digital converter 1 in this embodiment, the propagation information D output by the state transition section 10 is explained as including 7-bit information including signals D0 to D6. Accordingly, in the following explanation, the propagation information D is sometimes referred to as propagation information D[6, 0]. The count information q output by the state transition section 10 is explained as including 2-bit information of count values q0 and q1. Accordingly, in the following explanation, the count information q is sometimes referred to as count information q[1, 0]. The propagation information D and the count information q are not limited to the bit numbers described above and may have different bit numbers according to an amount of information output by the state transition section 10.

The transition-state acquiring section 20 acquires, in synchronization with the reference clock signal CLK, the propagation information D and the count information q output as the state information from the state transition section 10 and holds the propagation information D and the count information q as propagation information S and count information Q. The propagation information S and the count information Q are output from the transition-state acquiring section 20 in synchronization with the reference clock signal CLK.

The propagation information D and the propagation information S include the same information. Therefore, when the transition-state acquiring section 20 acquires the 7-bit propagation information D[6, 0] of the signals D0 to D6, the transition-state acquiring section 20 holds 7-bit propagation information S including signals S0 to S6. Accordingly, in the following explanation, the propagation information S corresponding to the propagation information D[6, 0] is sometimes referred to as propagation information S[6, 0].

Similarly, the count information q and the count information Q include the same information. Therefore, when the transition-state acquiring section 20 acquires 2-bit count information q[1, 0] of the count values q0 and q1, the transition-state acquiring section 20 holds 2-bit count information Q of count values Q0 and Q1. Accordingly, in the following explanation, the count information Q corresponding to the count information q[1, 0] is sometimes referred to as count information Q[1, 0].

The propagation information D and the count information Q output from the transition-state acquiring section 20 are input to the arithmetic operation section 30. The arithmetic operation section 30 calculates, based on the state information including the propagation information S and the count information q acquired by the transition-state acquiring section 20, the time digital value TD or the time digital value TDX corresponding to the number of times of transition of the internal state in the state transition section 10 and outputs the time digital value TD or the time digital value TDX.

The propagation information D acquired by the transition-state acquiring section 20 is an example of propagation information in this embodiment. The propagation information S obtained by acquiring the propagation information D at timing synchronizing with the reference clock signal CLK is also an example of propagation information in a broad sense. Similarly, the count information q acquired by the transition-state acquiring section 20 is an example of count information in this embodiment. The count information Q obtained by acquiring the count information q at timing synchronizing with the reference clock signal CLK is also an example of count information in a broad sense. Information including the propagation information D and the count information q output by the state transition section 10 is an example of state information. Similarly, information including the propagation information S and the count information Q output by the transition-state acquiring section 20 is another example of the state information.

Figure 2:
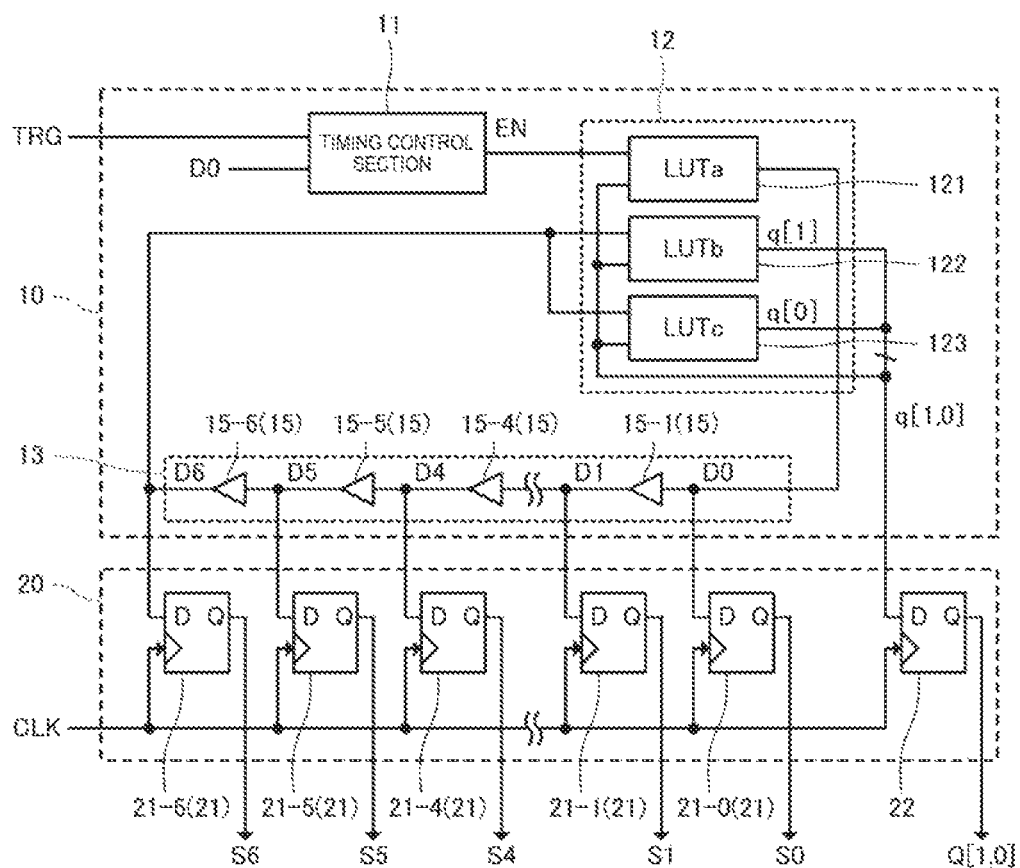
FIG. 2 is a diagram showing a configuration example of a state transition section and a transition-state acquiring section.

Configurations of the State Transition Section and the Transition-State Acquiring Section First, the configurations of the state transition section 10 and the transition-state acquiring section 20 are explained with reference to FIG. 2. FIG. 2 is a diagram showing a configuration example of the state transition section 10 and the transition-state acquiring section 20. As shown in FIG. 2, the state transition section 10 is a circuit including a timing control circuit 11, a state machine 12, and a tapped delay line 13.

The tapped delay line 13 includes a plurality of delay elements 15 configured by buffer elements, inverter elements, or the like. The tapped delay line 13 is a delay line in which the plurality of delay elements 15 are coupled in a chain shape in a signal path leading from an input end to an output end at a last stage. The tapped delay line 13 includes one input end and output ends at a plurality of stages. Such a tapped delay line 13 is called tapped delay line (TDL) as well. The tapped delay line 13 included in the time to digital converter 1 in this embodiment includes six delay elements 15-1 to 15-6 as the plurality of delay elements 15. The tapped delay line 13 is configured by coupling the delay elements 15-1 to 15-6 in a chain shape in the order of the delay elements 15-1 to 15-6 from the input end toward the output end of the tapped delay line 13.

An input end of the delay element 15-1 present at the head of the chain configuring the tapped delay line 13 is an input end of the tapped delay line 13. Input ends of the respective delay elements 15-1 to 15-6 configuring the chain and an output end of the delay element 15-6 present at the end of the chain are output ends at the respective stages of the tapped delay line 13. In other words, the input end of the delay element 15-1 present at the head of the chain is also an output end at the first stage of the tapped delay line 13. An output end of the delay element 15-6 present at the end of the chain is an output end at the last stage of the tapped delay line 13. Therefore, signals input to the respective delay elements 15-1 to 15-6 are output from the output ends at the respective stages excluding the last stage of the tapped delay line 13. A signal output from the delay element 15-6 present at the end of the chain is output from the output end at the last stage of the tapped delay line 13.

In the following explanation, signals output from the output ends of the tapped delay line 13 located at the input ends of the respective delay elements 15-1 to 15-6 are equivalent to the signals D0 to D5 in order from the input end side of the tapped delay line 13. A signal output from the output end of the tapped delay line 13 located at the output end of the delay element 15-6 is equivalent to the signal D6. In other words, the tapped delay line 13 propagates input signals via the delay elements 15-1 to 15-6 and outputs the signals D0 to D6 as the propagation information D[6, 0] from the output ends at the plurality of stages provided in the signal path leading from the input end to the output end at the last stage of the tapped delay line 13.

In the tapped delay line 13 configured as explained above, a logical level of the signal input to the input end of the tapped delay line 13 is sequentially propagated to the input ends of the delay elements 15 at the later stages according to elapse of delay times specified by the delay elements 15. Specifically, when a signal at the H level is input to the input end of the tapped delay line 13, a logical level of the signal D0 changes to the H level. After the logical level of the signal D0 changes to the H level, when a delay time specified by the delay element 15-1 elapses, a logical level of the signal D1 changes to the H level. After the logical level of the signal D1 changes to the H level, when a delay time specified by the delay element 15-2 elapses, a logical level of the signal D2 changes to the H level. In other words, after a logical level of a signal Di (i is any one of 0 to 5) changes to the H level, when a delay time specified by a delay element 15-$i$+1 elapses, a logical level of a signal Di+1 changes to the H level. Similarly, after the logical level of the signal Di changes to the L level, when the delay time specified by the delay element 15-$i$+1 elapses, the logical level of the signal Di+1 changes to the L level.

In other words, the tapped delay line 13 sequentially propagates the logical level of the input signal to the delay elements 15 at the later stages according to the delay times of the delay elements 15. Consequently, the state of the tapped delay line 13 transitions. In other words, when the state of the tapped delay line 13 transitions, the internal state of the state transition section 10 transitions. In this case, the signals D0 to D6 output from the output ends of the tapped delay line 13 indicate a part of the internal state of the state transition section 10.

The timing control circuit 11 is provided to be electrically coupled to the input end of the tapped delay line 13. The timing control circuit 11 controls, based on the logical level of the trigger signal TRG, start timing of the state transition in the state transition section 10. In the following explanation, it is assumed that the signal D0 is input to the timing control circuit 11 from the input end of the tapped delay line 13. Any one of the signals D1 to D5 may be input to the timing control circuit 11 from the tapped delay line 13.

Figure 3:
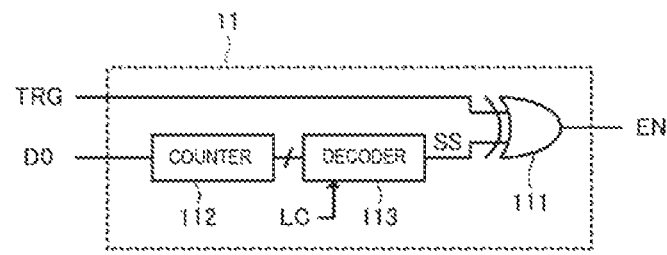
FIG. 3 is a diagram showing an example of the configuration of a time control circuit.

FIG. 3 is a diagram showing an example of the configuration of the timing control circuit 11. Specifically, the timing control circuit 11 includes an exclusive OR circuit 111, a counter 112, and a decoder 113. The trigger signal TRG and the signal D0 output from the tapped delay line 13 are input to the timing control circuit 11.

The signal D0 is input to the counter 112. The counter 112 counts a rising edge of the signal D0. The counter 112 outputs a count value of the count to the decoder 113. A limited number of times value LC specifying an upper limit of the count value counted by the counter 112 is also input to the decoder 113. The decoder 113 changes a logical level of a control signal SS based on the count value counted by the counter 112 and the limited number of times value LC. The counter 112 may count, for example, a falling edge of the signal D0 or may count both of the rising edge and the falling edge.

The trigger signal TRG and the control signal SS are input to the exclusive OR circuit 111. When the logical levels of the trigger signal TRG and the control signal SS are the same, the exclusive OR circuit 111 sets an enable signal EN to be output to the L level. When the logical levels of the trigger signal TRG and the control signal SS are different, the exclusive OR circuit 111 sets the enable signal EN to the H level. The timing control circuit 11 is an example of a logical circuit in this embodiment.

Referring back to FIG. 2, the state machine 12 is provided on a signal path of a signal propagated between the timing control circuit 11 and the tapped delay line 13. The state machine 12 determines, based on an input signal, a logical level of a signal input to the tapped delay line 13 and outputs the count information q[1, 0].

Specifically, the state machine 12 includes an LUT (Lookup table) a121, an LUT b122, and an LUT c123. The enable signal EN, a count value q1, and a count value q0 are input to the LUT a121. The signal D6, the count value q1, and the count value q0 are input to each of the LUT b122 and the LUT c123. The LUT a121 outputs the signal D0 having a logical level corresponding to logical levels of the enable signal EN, the count value q1, and the count value q0 input to the LUT a121. The LUT b122 outputs the count value q1 having a logical level corresponding to logical levels of the signal D6, the count value q1, and the count value q0 input to the LUT b122. The LUT c123 outputs the count value q0 having a logical level corresponding to logical levels of the signal D6, the count value q1, and the count value q0 input to the LUT c123.

FIG. 4 is a diagram showing an example of a truth table of the LUT a121. In FIG. 4, signals being at the H level is shown as "1" and the signals being at the L level is shown as "0".

As shown in FIG. 4, the LUT a121 outputs a signal having a logical level conforming to content described in FIG. 4 according to the logical levels of the enable signal EN, the count value q1, and the count value q0 input to the LUT a121. For example, when the logical levels of the enable signal EN, the count value q1, and the count value q0 are the L level, the L level, and the L level, the LUT a121 continuously outputs the present logical level of the signal D0. When the logical levels of the enable signal EN, the count value q1, and the count value q0 are the H level, the L level, and the L level, the LUT a121 sets the signal D0 to the H level. When the logical levels of the Enable signal EN, the count value q1, and the count value q0 are the H level, the H level, and the L level, the LUT a121 sets the signal D0 to the L level.

FIG. 5 is a diagram showing an example of a truth table of the LUT b122 and the LUT c123. In FIG. 5, the signals being at the H level is shown as "1" and the signals being at the L level is shown as "0".

As shown in FIG. 5, each of the LUT b122 and the LUT c123 outputs a signal having a logical level conforming to content described in FIG. 5 according to the logical levels of the signal D6, the count value q1, and the count value q0 input to the LUT. For example, when the logical levels of the signal D6, the count value q1, and the count value q0 are the H level, the L level, and the H level, the LUT b122 sets the count value q1 to the L level and the LUT c123 sets the count value q0 to the H level. When the logical levels of the signal D6, the count value q1, and the count value q0 are the L level, the H level, and the H level, the LUT b122 sets the count value q1 to the H level and the LUT c123 sets the count value q0 to the H level. The count value q1 and a count value q2 are reset to "0" by a not-shown reset signal after the state transition of the state transition section 10 stops.

The state transition section 10 configured as explained above functions as an oscillation circuit. When the state transition section 10 starts oscillation, states of the signals D0 to D6 and the count values q0 and q1 output from the tapped delay line 13 change. In other words, when the state transition section 10 starts oscillation, the state transition of the state transition section 10 starts.

Specifically, when the input trigger signal TRG is at the L level and the control signal SS is at the L level, the exclusive OR circuit 111 sets the enable signal EN to be output to the L level. When the input trigger signal TRG is at the H level and the control signal SS is at the H level, the exclusive OR circuit 111 sets the enable signal EN to be output to the L level. In this case, the signal D0 output from the state machine 12 stabilizes at the L level. In other words, when the logical levels of the trigger signal TRG and the control signal SS are the same, the state transition section 10 stops the oscillation. In other words, the state transition section 10 settles down in a state in which the state transition of the state transition section 10 does not occur. Since the state transition of the state transition section 10 does not occur, the count value q1 and the count value q2 are reset to "0".

On the other hand, when the input trigger signal TRG is at the H level and the control signal SS is at the L level or when the input trigger signal TRG is at the L level and the control signal SS is at the H level, the exclusive OR circuit 111 sets the enable signal EN to be output to the H level. Consequently, the LUT a121 sets the signal D0 to the H level. As a result, the state machine 12 changes the logical level of the signal D0, the count value q1, and the count value q0 with the contents shown in FIGS. 4 and 5 according to the logical levels of the signal D6, the count value q1, and the count value q0 input to the state machine 12. When the signal D0 having the logical level is input to the tapped delay line 13, the logical levels of the signals D0 to D6 propagated by the tapped delay line 13 sequentially change. In other words, the internal state of the state transition section 10 transitions. The signal D6 output from the tapped delay line 13 is input to the LUT b122 and the LUT c 123. Consequently, the logical levels of the count value q1 and the count value q0 change. When the logical levels of the count value q1 and the count value q0 change, the logical level of the signal D0 output by the LUT a121 changes. When the state machine 12 repeats the operation explained above, the state transition section 10 repeats the same operation. Accordingly, the state transition section 10 operates as an oscillation circuit. In other words, the state transition of the state transition section 10 is continuously implemented.

In this case, the counter 112 counts the number of times of inversion of the logical level of the signal D0 involved in the oscillation operation of the state transition section 10. The counter 112 outputs a count value corresponding to the count to the decoder 113. The decoder 113 compares the count value output from the counter 112 and the limited number of times value LC. When the count value reaches the limited number of times value LC, the decoder 113 inverts the logical level of the control signal SS. Consequently, the logical levels of the trigger signal TRG and the control signal SS become the same and the enable signal EN changes to the L level. Therefore, the state transition section 10 stops the oscillation operation. In other words, when the number of times of transition of the internal state exceeds the number of times based on the limited number of times value LC, the state transition section 10 stops the state transition. In this way, it is possible to stop the state transition of the state transition section 10 as appropriate according to a measurement target of the time to digital converter 1. It is possible to reduce an operation load and power consumption of the state transition section 10 and the time to digital converter 1 including the state transition section 10. The limited number of times value LC may be able to be changed as appropriate according to a configuration in which the time to digital converter 1 is used and the measurement target. The limited number of times value LC specifying the number of times of transition for stopping the state transition is an example of an upper limit value.

The transition-state acquiring section 20 includes a plurality of D flip-flops 21 respectively corresponding to the plurality of output ends of the tapped delay line 13. In other words, the transition-state acquiring section 20 included in the time to digital converter 1 in this embodiment includes seven D flip-flops 21-0 to 21-6 as the plurality of D flip-flops 21 respectively corresponding to the signals D0 to D6 output from the state transition section 10. The D flip-flops 21-0 to 21-6 respectively acquire the signals D0 to D6 in synchronization with a rising edge of the reference clock signal CLK and hold the signals S0 to S6 corresponding to the logical levels of the respective signals D0 to D6.

The transition-state acquiring section 20 includes a D flip-flop 22 for acquiring and holding the count information q[1, 0]. The D flip-flop 22 acquires, in synchronization with the rising edge of the reference clock signal CLK, the count information q[1, 0] output from the state transition section 10 and holds the count information q[1, 0] as the count information Q[1, 0]. As explained above, the count information q[1, 0] in this embodiment is a 2-bit signal. Therefore, although only one D flip-flop 22 is shown in FIG. 2, actually, two D flip-flops 22 are present.

Operations of the State Transition Section and the Transition-State Acquiring Section The operations of the state transition section 10 and the transition-state acquiring section 20 are explained. FIG. 6 is a diagram showing an example of the propagation information D[6, 0] and the count information q[1, 0] output from the state transition section 10. As explained above, when the state transition section 10 has not started the state transition, the timing control circuit 11 outputs the L-level enable signal EN. Therefore, the state machine 12 inputs the L-level signal D0 to the input end of the tapped delay line 13. A logical level of the signal D0 is propagated via the delay elements 15-1 to 15-6 of the tapped delay line 13. As a result, all of the signals D0 to D6 changes to the L level. When the state transition section 10 has not started the state transition, the count values q0 and q1 are reset to the L level. A state in which all of the signals D0 to D6 and the count values q0 and q1 are at the L level is referred to as zero-th state.

When the logical level of the trigger signal TRG input to the timing control circuit 11 is inverted, the enable signal EN changes to the H level. Consequently, the LUT a121 sets the signal D0 to the H level according to the content described in FIG. 4. Accordingly, the internal state of the state transition section 10 transitions to a first state in which the signal D0 is at the H level and the signals D1 to D6 and the count values q0 and q1 are at the L level.

After the internal state of the state transition section 10 transitions to the first state, when the delay time specified by the delay element 15-1 elapses, the logical level of the signal D0 is propagated to the signal D1. Consequently, the signal D1 changes to the H level. At this time, the L-level count value q1 and the L-level count value q0 are input to the LUT a121. Therefore, the signal D0 maintains the H level. Accordingly, the internal state of the state transition section 10 transitions to a second state in which the signals D0 and D1 are at the H level and the signals D2 to D6 and the count values q0 and q1 are at the L level.

Thereafter, the signals D2 to D6 sequentially change to the H level according to the delay times respectively specified by the delay elements 15-2 to 15-6. At this time, the signal D0 output from the LUT a121 maintains the H level. Consequently, the internal state of the state transition section 10 sequentially transitions in the order of a third state to a seventh state. The seventh state is a state in which an H-level signal input to the tapped delay line 13 is propagated to the signal D6.

When the internal state of the state transition section 10 is the seventh state, the H-level signal D6, the L-level count value q1, and the L-level count value q0 are input to the LUT b122 and the LUT c123. Therefore, the LUT b122 and the LUT c123 set the count value q0 to the H level according to the content described in FIG. 5. Accordingly, the internal state of the state transition section 10 transitions to an eighth state in which the signals D0 to D6 and the count value q0 are at the H level and the count value q1 is at the L level.

When the internal state of the state transition section 10 transitions to the eighth state, the L-level count value q1 and the H-level count value q0 are input to the LUT a121. Therefore, the LUT a121 sets the signal D0 to the L level according to the content described in FIG. 4. Accordingly, the internal state of the state transition section 10 transitions to a ninth state in which the signal D0 and the count value q1 are at the L level and the signals D1 to D6 and the count value q0 are at the H level.

After the internal state of the state transition section 10 transitions to the ninth state, when the delay time specified by the delay element 15-1 elapses, the logical level of the signal D0 is propagated to the signal D1. Consequently, the signal D1 changes to the L level. At this time, the L-level count value q1 and the H-level count value q0 are input to the LUT a121. Therefore, the signal D0 maintains the L level. Accordingly, the internal state of the state transition section 10 transitions to a tenth state in which the signals D0 and D1 and the count value q1 are at the L level and the signals D2 to D6 and the count value q0 are at the H level.

Thereafter, the signals D2 to D6 sequentially change to the L level according to the delay times respectively specified by the delay elements 15-2 to 15-6. At this time, the signal D0 output from the LUT a121 maintains the L level. Consequently, the internal state of the state transition section 10 sequentially transitions in the order of an eleventh state to a fifteenth state. The fifteenth state is a state in which an L-level signal input to the tapped delay line 13 is propagated to the signal D6.

When the internal state of the state transition section 10 is the fifteenth state, the L-level signal D6, the L-level count value q1, and the H-level count value q0 are input to the LUT b122 and the LUT c123. Therefore, the LUT b122 and the LUT c123 set the count value q1 to the H level according to the content described in FIG. 5. Accordingly, the internal state of the state transition section 10 transitions to a sixteenth state in which the signals D0 to D6 are at the L level and the count values q0 and q1 are at the H level.

When the internal state of the state transition section 10 transitions to the sixteenth state, the H-level count value q1 and the H-level count value q0 are input to the LUT a121. Therefore, the LUT a121 sets the signal D0 to the H level according to the content described in FIG. 4. Accordingly, the internal state of the state transition section 10 transitions to a seventeenth state in which the signal D0, the count value q1, and the count value q0 are at the H level and the signals D1 to D6 are at the L level.

After the internal state of the state transition section 10 transitions to the seventeenth state, when the delay time specified by the delay element 15-1 elapses, the logical level of the signal D0 is propagated to the signal D1. Consequently, the signal D1 changes to the H level. At this time, the H-level count value q1 and the H-level count value q0 are input to the LUT a121. Therefore, the signal D0 maintains the H level. Accordingly, the internal state of the state transition section 10 transitions to an eighteenth state in which the signals D0 and D1, the count value q1, and the count value q0 are at the H level and the signals D2 to D6 are at the L level.

Thereafter, the signals D2 to D6 sequentially change to the H level according to the delay times respectively specified by the delay elements 15-2 to 15-6. At this time, the signal D0 output from the LUT a121 maintains the H level. Consequently, the internal state of the state transition section 10 sequentially transitions in the order of a nineteenth state to a twenty-third state. The twenty-third state is a state in which an H-level signal input to the tapped delay line 13 is propagated to the signal D6.

When the internal state of the state transition section 10 is the twenty-third state, the H-level signal D6, the H-level count value q1, and the H-level count value q0 are input to the LUT b122 and the LUT c123. Therefore, the LUT b122 and the LUT c123 set the count value q0 to the L level according to the content described in FIG. 5. Accordingly, the internal state of the state transition section 10 transitions to a twenty-fourth state in which the signals D0 to D6 and the count value q1 are at the H level and the count value q0 is at the L level.

When the internal state of the state transition section 10 transitions to the twenty-fourth state, the H-level count value q1 and the L-level count value q0 are input to the LUT a121. Therefore, the LUT a121 sets the signal D0 to the L level according to the content described in FIG. 4. Accordingly, the internal state of the state transition section 10 transitions to a twenty-fifth state in which the signal D0 and the count value q0 are at the L level and the signals D0 to D6 and the count value q1 are at the H level.

After the internal state of the state transition section 10 transitions to the twenty-fifth state, when the delay time specified by the delay element 15-1 elapses, the logical level of the signal D0 is propagated to the signal D1. Consequently, the signal D1 changes to the L level. At this time, the H-level count value q1 and the L-level count value q0 are input to the LUT a121. Therefore, the signal D0 maintains the L level. Accordingly, the internal state of the state transition section 10 transitions to a twenty-sixth state in which the signals D0 and D1 and the count value q0 are at the L level and the signals D2 to D6 and the count value q1 are at the H level.

Thereafter, the signals D2 to D6 sequentially change to the L level according to the delay times respectively specified by the delay elements 15-2 to 15-6. At this time, the signal D0 output from the LUT a121 maintains the L level.

Consequently, the internal state of the state transition section 10 sequentially transitions in the order of a twenty-seventh state to a thirty-first state. The thirty-first state is a state in which an L-level signal input to the tapped delay line 13 is propagated to the signal D6.

When the internal state of the state transition section 10 is the thirty-first state, the H-level count value q1 and the L-level count value q0 are input to the LUT b122 and the LUT c123. Therefore, the LUT b122 and the LUT c123 set the count value q1 to the L level according to the content described in FIG. 5. Accordingly, the internal state of the state transition section 10 transitions to the zero-th state in which the signals D0 to D6 and the count values q0 and q1 are at the L level.

Thereafter, similarly, the internal state of the state transition section 10 repeats the state transition between the zero-th state and the thirty-first state.

As explained above, the state information indicating the internal state of the state transition section 10 is represented by the count information q[1, 0] output from the state machine 12 and the propagation information D[6, 0] output from the tapped delay line 13. Before and after the state transition of the state transition section 10, a signal included in the state information changes only by one bit. In other words, a hamming distance of the state information before and after the state transition is "1".

By setting the hamming distance of the state information at the time when the state transition occurs in the state transition section 10 to 1, it is possible to reduce likelihood that, depending on timing when the reference clock signal CLK is input, an abnormality such as a hazard occurs in the state information acquired by the transition-state acquiring section 20.

The count information q[1, 0] indicates the number of times the logical level of the signal D0 output from the state machine 12 is propagated to the signal D6. FIG. 7 is a diagram showing a relation between the count values q0 and q1 included in the count information q[1, 0] and the number of times of propagation of the tapped delay line 13. A count value [Dec] shown in FIG. 7 is decimal representation of the number of times the logical level of the signal D0 output from the state machine 12 is propagated to the signal D6.

Specifically, as shown in FIG. 6, the signal D0 changes to the H level in the first state and the signal D6 changes to the H level because of the H-level signal in the seventh state. In the first state to the seventh state, the count values q0 and q1 included in the count information q[1, 0] are respectively at the L level and the L level. In other words, in the first state to the seventh state, information held as the count information q[1, 0] indicates that, as shown in FIG. 7, the number of times the logical level of the signal D0 output from the state machine 12 is propagated to the signal D6 is zero.

In the eighth state, the count value q0 and the count value q1 included in the count information q[1, 0] respectively change to the H level and the L level. Thereafter, the signal D0 changes to the L level in the ninth state and the signal D6 changes to the L level because of the L-level signal in the fifteenth state.

In the eighth state to the fifteenth state, the count values q0 and q1 included in the count information q[1, 0] are respectively at the H level and the L level. In other words, information held as the count information q[1, 0] in the eighth state to the fifteenth state indicates that, as shown in FIG. 7, the number of times the logical level of the signal D0 output from the state machine 12 is propagated to the signal D6 is one.

In the sixteenth state, the count value q0 and the count value q1 included in the count information q[1, 0] respectively change to the H level and the H level. Thereafter, the signal D0 changes to the H level in the seventeenth state and the signal D6 changes to the H level because of the H-level signal in the twenty-third state. In the seventeenth state to the twenty-third state, the count values q0 and q1 included in the count information q[1.0] are respectively at the H level and the H level. In other words, information held as the count information q[1. 0] in the sixteenth state to the twenty-third state indicates that, as shown in FIG. 7, the number of times the logical level of the signal D0 output from the state machine 12 is propagated to the signal D6 is two.

In the twenty-fourth state, the count value q0 and the count value q1 included in the count information q[1, 0] respectively change to the L level and the H level. Thereafter, the signal D0 changes to the L level in the twenty-fifth state and the signal D6 changes to the L level because of the L-level signal in the thirty-first state. In the twenty-fifth state to the thirty-first state, the count values q0 and q1 included in the count information q[1, 0] are respectively at the H level and the L level. In other words, information held as the count information q[1, 0] in the twenty-fourth state to the thirty-first state indicates that, as shown in FIG. 7, the number of times the logical level of the signal D0 output from the state machine 12 is propagated to the signal D6 is three.

In the zero-th state, the count value q0 and the count value q1 included in the count information q[1, 0] respectively change to the L level and the L level. In other words, as shown in FIG. 7, the number of times the logical level of the signal D0 output from the state machine 12 is propagated to the signal D6 is reset.

Figure 8:
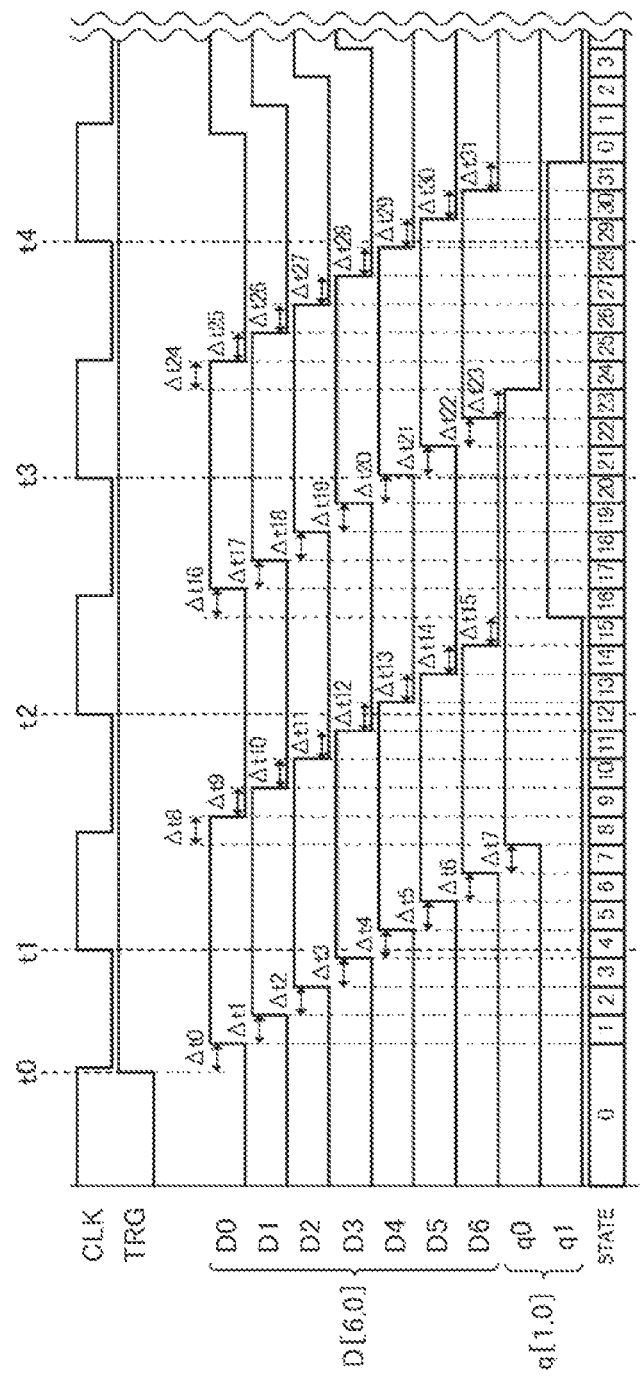
FIG. 8 is a diagram for explaining the operation of the transition-state acquiring section.

The operation of the transition-state acquiring section 20 is explained with reference to FIG. 8. FIG. 8 is a diagram for explaining the operation of the transition-state acquiring section 20. The transition-state acquiring section 20 acquires, in synchronization with the reference clock signal CLK, the propagation information D[6, 0] and the count information q[1, 0] corresponding to the zero-th state output from the state transition section 10 and holds the propagation information D[6, 0] and the count information q[1, 0] as the propagation information S[6, 0] and the count information Q[1, 0]. As shown in FIG. 8, in the time to digital converter 1, the logical level of the trigger signal TRG is inverted from the L level to the H level at time t0. Consequently, the state transition section 10 starts the state transition.

Specifically, when the logical level of the trigger signal TRG is inverted and a time Δt0 elapses, the internal state of the state transition section 10 transitions from the zero-th state to the first state. After transitioning to the first state, when a time Δt1 elapses, the internal state of the state transition section 10 transitions to the second state in which the signal D1 is at the H level. Thereafter, after transitioning to an i-th state (i is any one of 1 to 30), the internal state of the state transition section 10 transitions to an i+1-th state when a time Δti elapses. Times Δt0 to Δt31 shown in FIG. 8 are equivalent to a time required for signal processing in the state machine 12 and delay times that respectively occur in the delay elements 15-1 to 15-7. In other words, the state transition section 10 continues the state transition with the content shown in FIG. 6 according to the times Δt0 to Δt31.

The transition-state acquiring section 20 acquires, in synchronization with a rising edge of the reference clock signal CLK at time t1, the propagation information D[6, 0] and the count information q[1, 0] corresponding to the fourth state. Specifically, the respective D flip-flops 21-0 to 21-6 included in the transition-state acquiring section 20 acquire, in synchronization with the reference clock signal CLK, the signals D0 to D6 corresponding to the fourth state and hold the signals D0 to D6 as the signals S0 to S6. The D flip-flop 22 acquires, in synchronization with the reference clock signal CLK, the count values q0 and q1 corresponding to the fourth state and holds the count values q0 and q1 as the count values Q0 and Q1. The transition-state acquiring section 20 outputs the held propagation information S[6, 0] and the held count information Q[1, 0] to the arithmetic operation section 30.

Thereafter, similarly, the transition-state acquiring section 20 acquires, in synchronization with the rising edge of the reference clock signal CLK, the propagation information D[6, 0] and the count information q[1, 0] corresponding to the internal state of the state transition section 10 continuously at times t2, t3, t4, and outputs the propagation information D[6, 0] and the count information q[1, 0] to the arithmetic operation section 30 as the propagation information S[6, 0] and the count information Q[1, 0].

Figure 9:
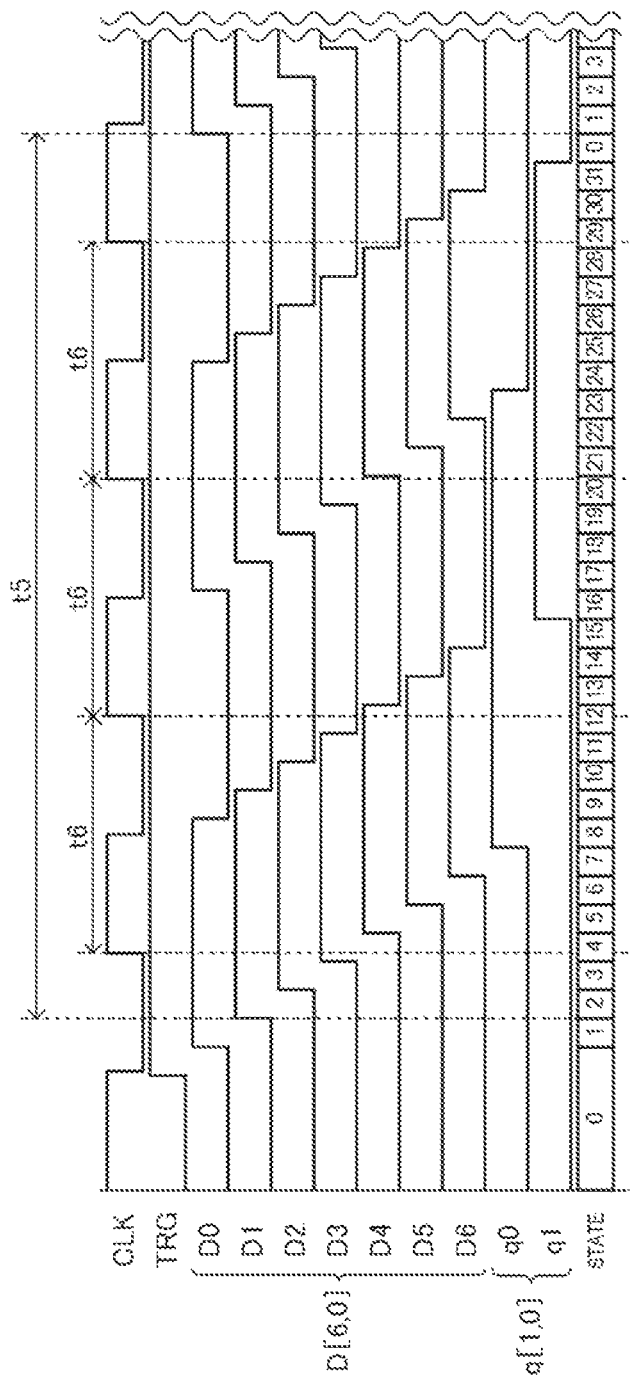
FIG. 9 is a diagram for explaining a relation between a time of a cycle until an internal state of the state transition section transitions to the same internal state and a time of a cycle in which state information acquired by the transition-state acquiring section is updated.

A relation between a time of a cycle until the internal state of the state transition section 10 transitions to the same internal state and a time of a cycle in which state information acquired by the transition-state acquiring section 20 is updated is explained with reference to FIG. 9. FIG. 9 is a diagram for explaining the relation between a time of a cycle until the internal state of the state transition section 10 transitions to the same internal state and a time of a cycle in which state information acquired by the transition-state acquiring section 20 is updated.

As explained above, the internal state of the state transition section 10 in this embodiment transitions in the order of the zero-th state, the first state, the second state, . . . , and the thirty-first state. After transitioning to the thirty-first state, the internal state of the state transition section 10 reverts to the zero-th state. In other words, the internal state of the state transition section 10 cyclically transitions in one cycle of the zero-th state to the thirty-first state. Specifically, as shown in FIG. 9, when focusing on the first state as the internal state of the state transition section 10, the internal state of the state transition section 10 transitions from the first state to the second state and, thereafter, when a time interval t5 elapses, transitions from the zero-th state to the first state. In other words, the internal state of the state transition section 10 requires a time of the time interval t5 to reverted from the first state to the second state and transition to the first state.

On the other hand, the transition-state acquiring section 20 in this embodiment detects the rising edge of the reference clock signal CLK to acquire, as new state information, the propagation information D[6, 0] and the count information q[1, 0] and holds the propagation information D[6, 0] and the count information q[1, 0] as the propagation information S[6, 0] and the count information Q[1, 0]. In other words, the transition-state acquiring section 20 updates the held state information according to a cycle t6 of the reference clock signal CLK.

If the time interval t5 is shorter than the cycle t6, the internal state of the state transition section 10 sometimes transitions over a plurality of cycles in the cycle t6 for updating the state information held by the transition-state acquiring section 20. Accordingly, in order to measure the number of times of transition of the internal state, the state transition section 10 needs to include a counter for counting the number of times of a transition cycle of the internal state. However, when a transition cycle of the internal state is short with respect to the cycle of the reference clock signal CLK, a counter for counting the number of times of the transition cycle needs to operate at high speed in order to reduce likelihood of occurrence of a hazard. Accordingly, the configurations of the counter and the time to digital converter 1 including the counter may become complicated.

Therefore, in the time to digital converter 1 in this embodiment, as shown in FIG. 9, the time interval t5 from when the internal state of the state transition section transitions from the first state to the second state until when the internal state reverts to the first state is longer than an interval of the cycle t6 in which the state information held by the transition-state acquiring section 20 is updated.

Since the time interval t5 is set longer than the cycle t6, the state transition section 10 cannot take the same internal state in the cycle t6 in which the state information held by the transition-state acquiring section 20 is updated. Therefore, the state transition section 10 does not need to include a counter for counting the number of cycles of the state transition. Even if the state transition section 10 includes the counter for counting the number of cycles of the state transition, since the cycle of the state transition of the state transition section 10 is long with respect to the reference clock CLK, the state transition section 10 does not need to include a counter that operates at high speed. Therefore, it is possible to reduce likelihood that the configurations of the counter, the state transition section 10 including the counter, and the time to digital converter 1 including the state transition section 10 are complicated.

Any one of the zero-th state to the thirty-first state, which are internal states of the state transition section 10, is an example of a first internal state. An internal state next to the first internal state is an example of a second internal state.

Configuration of the Arithmetic Operation Section

Figure 10:
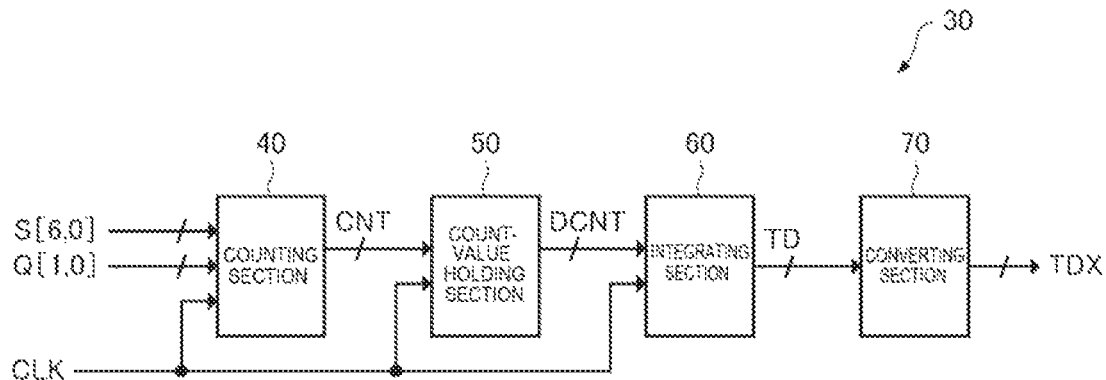
FIG. 10 is a diagram showing a configuration example of an arithmetic operation section.

The configuration of the arithmetic operation section 30 is explained. FIG. 10 is a diagram showing a configuration example of the arithmetic operation section 30. As shown in FIG. 10, the arithmetic operation section includes a counting section 40, a count-value holding section 50, an integrating section 60, and a converting section 70. The arithmetic operation section 30 calculates the number of times of state transition in the state transition section 10 based on the state information including the propagation information S[6, 0] and the count information Q[1, 0], performs, on the calculated number of times of state transition, weighting based on elapse of time, and integrates the weighted number of times of state transition to calculate the time digital value TD or the time digital value TDX and output the time digital value TD or the time digital value TDX. The arithmetic operation section 30 can be configured by an MPU (Micro Processing Unit), an FPGA (field-programmable gate array), or the like.

Figure 11:
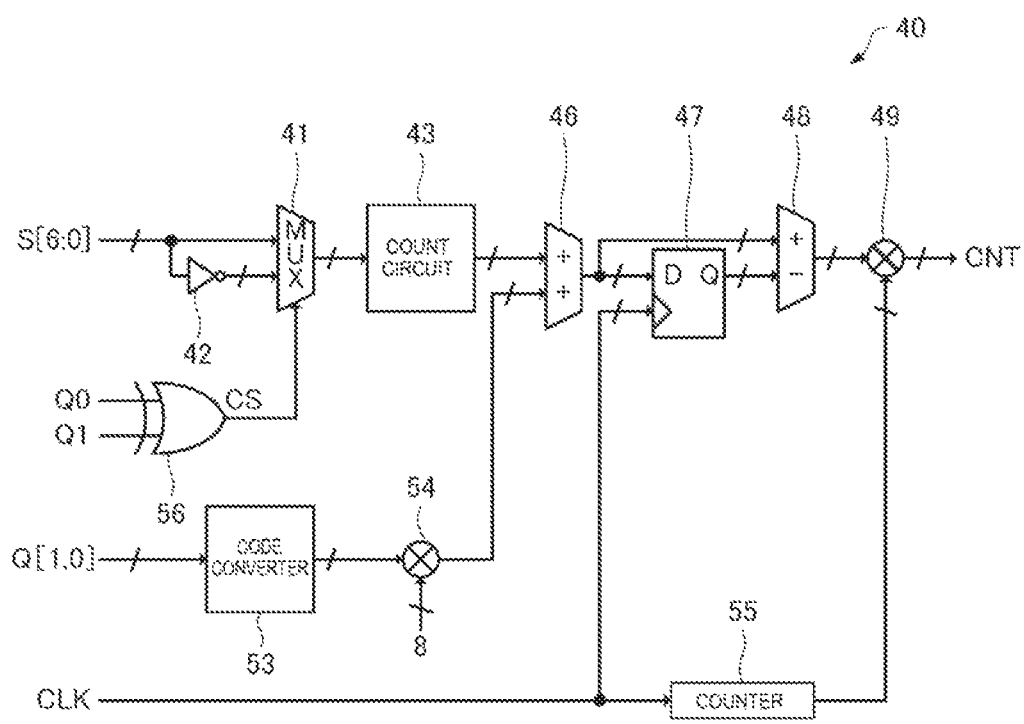
FIG. 11 is a diagram showing a configuration example of a counting section.

FIG. 11 is a diagram showing a configuration example of the counting section 40. The counting section 40 includes an MUX (multiplexer) 41, an inversion circuit 42, a count circuit 43, an adder 46, a D flip-flop 47, a subtractor 48, a multiplier 49, a code converter 53, a multiplier 54, a counter 55, and an exclusive OR circuit 56. In FIG. 11, for simplification of illustration, only one D flip-flop 47 is shown. However, actually, a plurality of D flip-flops 47 as many as a bit number output from the adder 46 are present.

The count value Q0 and the count value Q1 are input to the exclusive OR circuit 56. When logical levels of the count value Q0 and the count value Q1 are the same, the exclusive OR circuit 56 sets a selection control signal CS to be output to the L level. When the logical levels of the count value Q0 and the count value Q1 are different, the exclusive OR circuit 56 sets the selection control signal CS to be output to the H level.

The selection control signal CS, the propagation information S[6, 0], and a signal obtained by inverting a logical level of the propagation information S[6, 0] with the inversion circuit 42 are input to the MUX 41. The MUX selects, based on a logical level of the selection control signal CS, whether the propagation information S[6, 0] is output to the count circuit 43 or the propagation information S[6, 0], the logical level of which is inverted, is output to the count circuit 43. In this embodiment, when the selection control signal CS is at the L level, the MUX 41 outputs the propagation information S[6, 0] to the count circuit 43. When the selection control signal CS is at the H level, the MUX 41 outputs the propagation information S[6, 0], the logical level of which is inverted, to the count circuit 43.

The count circuit 43 performs population counting of the number of "0"s or "1"s included in the signal input from the MUX 41, generates a signal having a value of any one of "0" to "8", and outputs the signal to the adder 46. In this embodiment, the count circuit 43 performs population counting of the number of "1"s included in the signal input from the MUX 41.

The count information Q[1, 0] is input to the code converter 53. The code converter 53 converts, according to the content shown in FIG. 7, the input count information Q[1, 0] into count information [Dec] corresponding to the input count information Q[1, 0]. Thereafter, the code converter 53 generates a binary signal corresponding to the count information [Dec] and outputs the binary signal to the multiplier 54.

The multiplier 54 multiplies the signal output from the code converter 53 by "8" to generate a signal having a value corresponding to a calculation result and outputs the signal to the adder 46. "8" used for the calculation by the multiplier 54 is equivalent to the number of times of the state transition of the internal state that occurs in the state transition section 10 at an interval at which a held value of the count information q[1, 0] is updated.

The adder 46 adds up the value of the signal output from the count circuit 43 and the value of the signal output from the multiplier 54 and outputs a calculation result. A value of a signal output by the adder 46 is equivalent to the number of times of transition the internal state of the state transition section 10 transitions in a time from when a trigger signal is input to the time to digital converter until when the transition-state acquiring section 20 acquires the propagation information D[6, 0].

Each of the plurality of D flip-flops 47 captures, in synchronization with the rising edge of the reference clock signal CLK, the value of the signal output from the adder 46 and holds the value of the signal.

The subtractor 48 subtracts the value of the signal held by the plurality of D flip-flops 47 from the value of the signal output from the adder 46 and outputs a value of a calculation result to the multiplier 49. The value of the calculation result output from the subtractor 48 is equivalent to the number of times the internal state of the state transition section 10 transitions in a time of nearest one cycle of the reference clock signal CLK. In the following explanation, the number of time the internal state of the state transition section 10 transitions in the time of the nearest one cycle of the reference clock signal CLK is sometimes referred to as count value.

The counter 55 is an up-counter that counts up in synchronization with the reference clock signal CLK. The counter 55 outputs a value of a signal indicating a result obtained by counting the reference clock signal CLK to the multiplier 49. In other words, the counter 55 outputs a signal, a value of which increases according to an elapsed time from the input of the trigger signal to the time to digital converter 1. In the following explanation, the signal output by the counter 55 is sometimes referred to as weight coefficient signal. A value included in the weight coefficient signal is sometimes referred to as weight coefficient.

The multiplier 49 multiplies together the count value and the weight coefficient to calculate a weighted count value CNT and outputs the weighted count value CNT from the counting section 40.

The count value, which is the number of times the internal state of the state transition section 10 transitions in the time of the nearest one cycle of the reference clock signal CLK, in this embodiment is an example of the number of times of state transition. In this embodiment, the weighted count value CNT is calculated by multiplying, by the weight coefficient, the number of times the internal state of the state transition section 10 transitions in the time of the nearest one cycle of the reference clock signal CLK. However, the weighted count value CNT may be calculated by multiplying, by the weight coefficient, the number of times of transition the internal state of the state transition section 10 transitions from when the trigger signal is input to the time to digital converter 1 until when the transition-state acquiring section 20 acquires the propagation information D[6, 0]. In other words, the number of times of transition is also equivalent to the number of times of state transition.

Although not shown in FIG. 11 and not explained, a reset signal for initializing a held value to "0" may be input to the plurality of D flip-flops 47 and the counter 55, for example, when the state transition of the tapped delay line 13 reaches a predetermined number of times and the state transition of the state transition section 10 stops.

Figure 12:
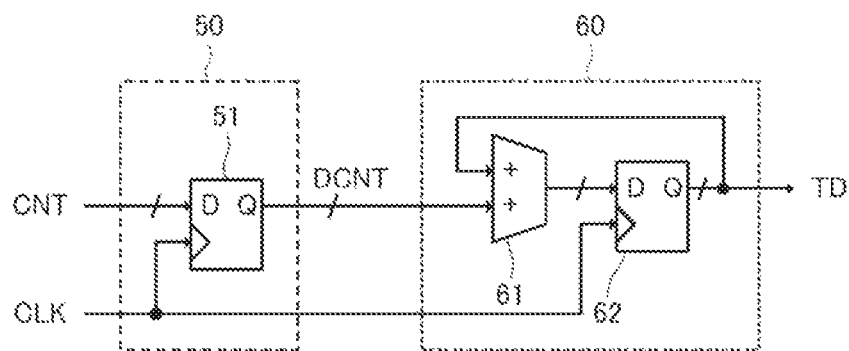
FIG. 12 is a diagram showing a configuration example of a count-value holding section and an integrating section.

The configurations of the count-value holding section 50 and the integrating section 60 are explained with reference to FIG. 12. FIG. 12 is a diagram showing a configuration example of the count-value holding section 50 and the integrating section 60. As shown in FIG. 12, the count-value holding section 50 includes a D flip-flop 51. The integrating section 60 includes an adder 61 and a D flip-flop 62. In FIG. 12, for simplification of illustration, only one D flip-flop 51 and one D flip-flop 62 are shown. However, actually, a plurality of D flip-flops 51 and a plurality of D flip-flops 62 may be present according to a bit number of an acquired and held signal.

The D flip-flop 51 acquires, in synchronization with the rising edge of the reference clock signal CLK, the weighted count value CNT output from the counting section 40 and holds the weighted count value as a weighted count value DCNT.

The adder 61 adds up the weighted count value DCNT held by the D flip-flop 51 and a value held by the D flip-flop 62 and outputs an added-up value to the D flip-flop 62. The D flip-flop 62 captures, in synchronization with the rising edge of the reference clock signal CLK, a value of a signal output from the adder 61 and holds the value as the time digital value TD.

Although not shown in FIG. 12 and not explained, reset signals for initializing held values to "0" may be respectively input to the D flip-flop 51 and the D flip-flop 62. Consequently, the time digital value TD is also initialized to 0.

Referring back to FIG. 10, the time digital value TD output from the integrating section 60 is input to the converting section 70. The converting section 70 converts the time digital value TD to generate the time digital value TDX. For example, the converting section 70 may perform predetermined scaling on the time digital value TD and generate the time digital value TDX. The converting section may convert the time digital value TD into the time digital value TDX according to a predetermined conversion formula or table information. The arithmetic operation section 30 may not include the converting section 70.

In this embodiment, a time event of the reference clock signal CLK is set independently from a time event of the trigger signal TRG. In other words, the time event of the reference clock signal CLK and the time event of the trigger signal TRG are asynchronous. Therefore, the time digital value TD or the time digital value TDX is used as a time stamp corresponding to the time event of the trigger signal TRG.

The time digital value TD or the time digital value TDX calculated by the arithmetic operation section 30 is output from the time to digital converter 1 via a not-shown terminal.

Action Effects

In the time to digital converter 1 in this embodiment, the state information indicating the internal state, which transitions in the state transition section 10, is represented by the count information q output from the state machine 12 and the propagation information D output from the tapped delay line 13 included in the state transition section 10, and the hamming distance before and after the state transition of the state information is "1". In other words, the count information q and the propagation information D transition in association with each other and represent the state information. Therefore, even when fluctuation occurs in a time in which a state obtained based on the count information q transitions or a time in which a state obtained based on the propagation information D transitions, likelihood of acquisition of wrong state information is reduced.

Further, in the time to digital converter 1 in this embodiment, the time interval t5 from when the internal state transitions from the first state to the second state until when the internal state reverts to the first state is set longer than the interval of the cycle t6 in which the propagation information S[6, 0] held by the transition-state acquiring section 20 is updated. Consequently, the state transition section 10 cannot take the same internal state in the cycle t6 for updating the propagation information S[6, 0] held by the transition-state acquiring section 20. Therefore, the state transition section 10 does not need to include a counter for counting the number of cycles of the state transition. Even if the state transition section 10 includes the counter for counting the number of cycles of the state transition, since the cycle of the state transition of the state transition section 10 is long with respect to the reference clock CLK, the state transition section 10 does not need to include a counter that operates at high speed. Therefore, it is possible to reduce likelihood that the configurations of the counter, the state transition section 10 including the counter, and the time to digital converter 1 including the state transition section 10 are complicated.

Modification

In the time to digital converter 1 explained above, the counting section 40 may correct the number of times of state transition using delay amounts of the plurality of delay elements 15 and a delay amount involved in arithmetic processing of the state machine 12.

Figures 13, 14:
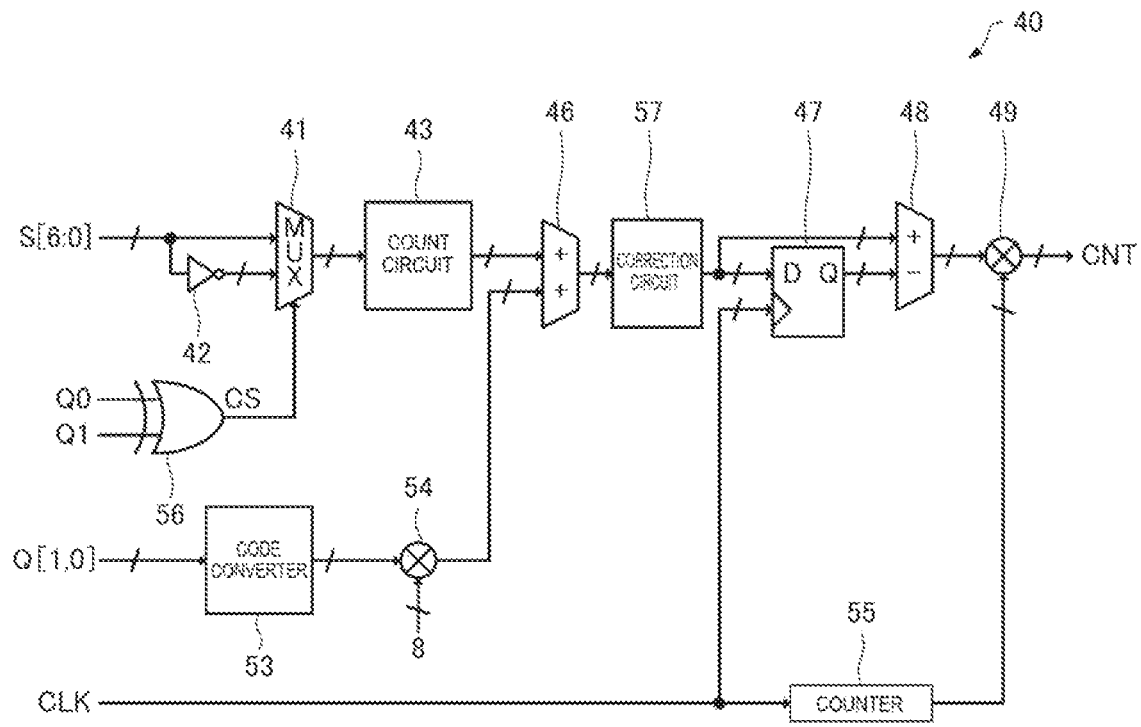
FIG. 13 is a diagram showing an example of the configuration of a counting section in a time to digital converter in a modification.
FIG. 14 is a diagram showing an example of a method of calculating a corrected number of times of transition corresponding to the number of times of transition.

FIG. 13 is a diagram showing an example of the configuration of the counting section 40 in the time to digital converter 1 in a modification. As shown in FIG. 13, the counting section 40 in the modification includes, on the output side of the adder 46, a correction circuit 57 for correcting the number of times of transition of the internal state. The correction circuit 57 outputs the number of times of transition of the internal state of the state transition section 10 as a corrected number of times of transition corresponding to the number of times of transition.

Specifically, a 6-bit signal corresponding to the number of times of transition of the internal state of the state transition section 10 is input to the correction circuit 57 from the adder 46. The correction circuit 57 converts the input 6-bit signal corresponding to the number of times of transition of the state transition section 10 into a 9-bit signal indicating the corrected number of times of transition corresponding to the 6-bit signal and outputs the signal. The signal indicating the corrected number of times of transition is stored in a not-shown storing section, for example, in a manufacturing process for the time to digital converter 1. When the signal corresponding to the number of times of transition of the state transition section 10 is input to the correction circuit 57, the correction circuit 57 reads out the signal indicating the corrected number of times of transition corresponding to the signal from the storing section. The bit number of the signal corresponding to the number of times of transition input from the adder 46 and the bit number of the signal indicating the corrected number of times of transition are examples and are not limited to this.

An example of a method of calculating the corrected number of times of transition corresponding to the number of times of transition is explained with reference to FIG. 14. FIG. 14 is a diagram showing the example of the method of calculating the corrected number of times of transition corresponding to the number of times of transition.

When the corrected number of times of transition is calculated, first, a frequency of the internal state in the state transition of the state transition section 10 is measured. Specifically, the state transition of the state transition section 10 is started. The propagation information D[6, 0] and the count information Q[1, 0] held by the transition-state acquiring section 20 are repeatedly acquired at any timing during execution of the state transition of the state transition section 10. The internal state of the state transition section 10 is calculated based on the propagation information D[6, 0] and the count information Q[1, 0] repeatedly acquired from the transition-state acquiring section 20. The number of times of occurrence of internal states that occur during the state transition of the state transition section 10 is counted. In the example shown in FIG. 14, a count value of a frequency in the zero-th state is "1496" counts and a count value of a frequency in the first state is "1214" counts.

The acquired count values of the frequencies of the internal state are normalized based on a time of one cycle of the internal state of the state transition section 10. Bin sizes corresponding to delay times of the delay elements 15 and a processing time of the state machine 12 are calculated. In the example shown in FIG. 14, a bin size of the state machine 12 in transition from the zero-th state to the first state is "779" psec and a bin size of the delay element 15-1 in transition from the first state to the second state is "632" psec. An integrated bin size [psec] is calculated by integrating the bin seizes [psec] in the internal state.

Subsequently, a bin representative value [psec] is calculated based on the integrated bin size [psec].

The bin representative value [psec] is obtained by calculating an average of a cumulative bin size [psec] of an internal state set as a calculation target of the corrected number of times of transition and a cumulative bin size [psec] of an immediately preceding internal state. For example, in the example shown in FIG. 14, a bin representative value [psec] corresponding to the first state is "1095" psec, which is an average of "1412" psec, which is a cumulative bin size [psec] in the first state, and "779" psec, which is a cumulative bin size [psec] in the immediately preceding zero-th state. The bin representative value [psec] corresponding to the first state is calculated assuming that the immediately preceding cumulative bin size [psec] is "0" psec.

Bin representative values [psec] calculated for the internal states are normalized by, for example, 0 to 128 to calculate a 9-bit corrected number of times of transition.

Effects of application of the correction circuit 57 to the time to digital converter 1 are explained with reference to FIGS. 15 to 17.

Figure 15:
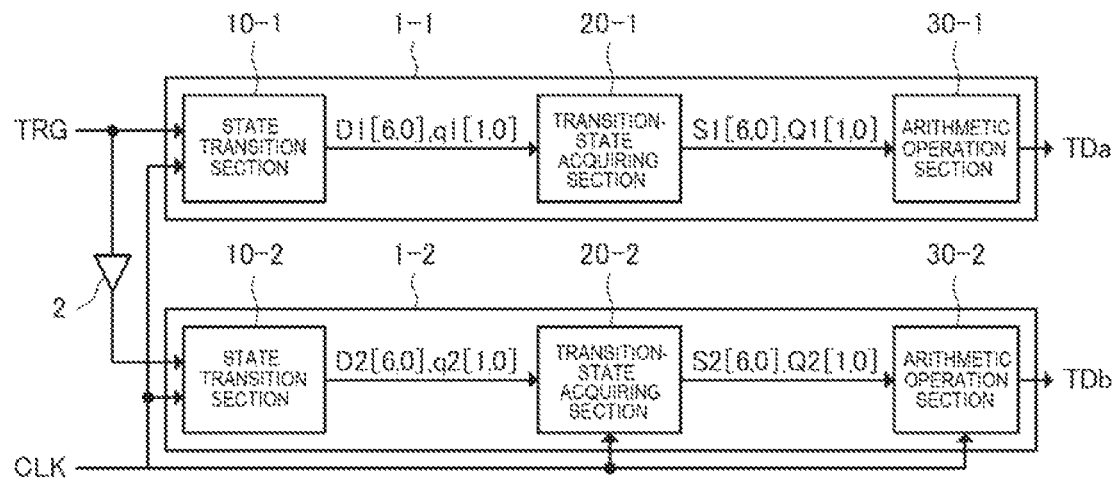
FIG. 15 is a diagram showing a test configuration for explaining effects in the modification.

FIG. 15 is a diagram showing a test configuration for explaining effects in this modification. In the test configuration, two time to digital converters 1-1 and 1-2 are used. A common reference clock signal CLK is input to the time to digital converter 1-1 and the time to digital converter 1-2. A common trigger signal TRG is input to the time to digital converter 1-1 and the time to digital converter 1-2 in a state in which the common trigger signal TRG is delayed by a delay time generated by a delay element 2. The time to digital converter 1-1 outputs a time digital value TDa corresponding to a time event of the input trigger signal TRG. The time to digital converter 1-2 outputs a time digital value TDb corresponding to a time event of the input delayed trigger signal TRG.

Figure 16:
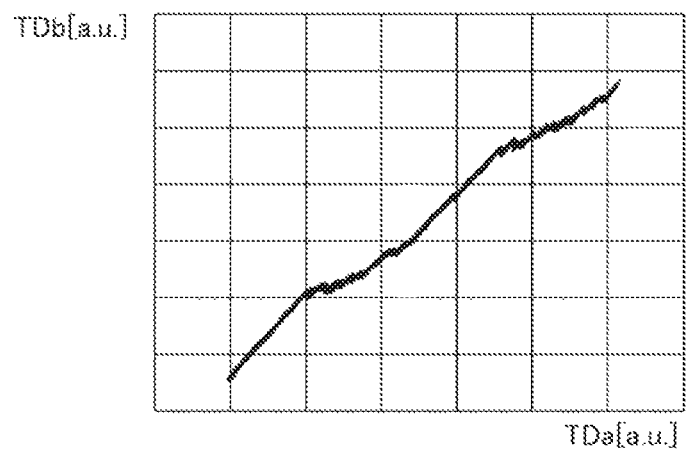
FIG. 16 is a diagram showing a relation between time digital values at the time when correction explained in the modification is not implemented.

FIG. 16 is a diagram showing a relation between the time digital value TDa and the time digital value TDb at the time when the correction explained in this modification is not implemented in the configuration shown in FIG. 15. FIG. 17 is a diagram showing a relation between the time digital value TDa and the time digital value TDb at the time when the correction explained in this modification is implemented in the configuration shown in FIG. 15.

Figure 17:
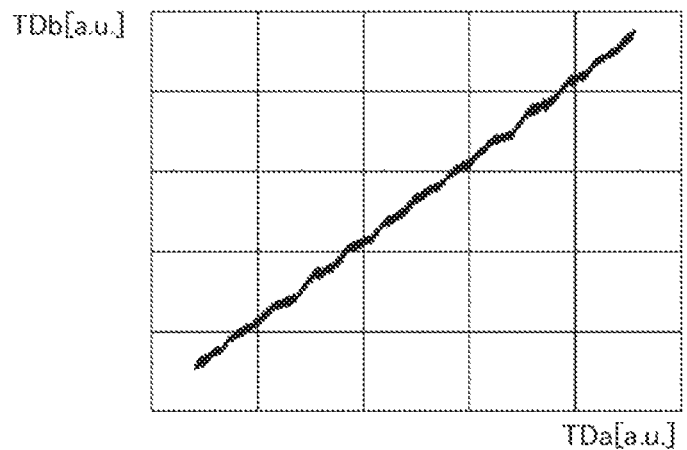
FIG. 17 is a diagram showing a relation between the time digital values at the time when the correction explained in the modification is implemented.

As shown in FIGS. 16 and 17, since the time to digital converters 1-1 and 1-2 include the correction circuit 57 in this modification, linearity between the time digital value TDa output from the time to digital converter 1-1 and the time digital value TDb output from the time to digital converter 1-2 is improved. In other words, fluctuation in the delay times of the delay elements 15 respectively included in the time to digital converters 1-1 and 1-2 and the processing time of the state machine 12 is reduced.

As explained above, in the time to digital converter 1 in the modification, it is possible to correct fluctuation that occurs in the delay times of the delay elements 15 and the processing time of the state machine 12. Therefore, even when fluctuation occurs in a time in which a state obtained based on the count information q transitions or a time in which a state obtained based on the propagation information D transitions, the likelihood of acquisition of wrong state information is further reduced.

1.2 Second Embodiment

The time to digital converter 1 in a second embodiment generates time digital values TDY1 to TDYm corresponding to at least two time intervals of time events of a plurality of trigger signals TRG. In the explanation of the time to digital converter 1 in the second embodiment, the same components as the components of the time to digital converter 1 in the first embodiment are denoted by the same reference numerals and signs. Explanation of the components is sometimes omitted or simplified.

Figure 18:
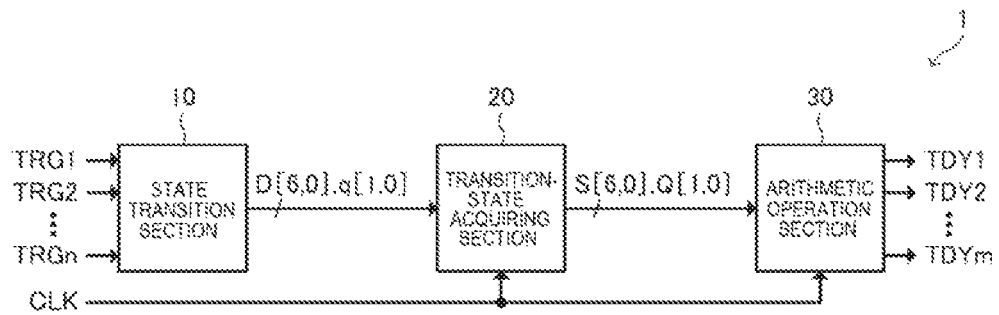
FIG. 18 is a diagram showing the configuration of a time to digital converter in a second embodiment.

FIG. 18 is a diagram showing the configuration of the time to digital converter 1 in the second embodiment. As shown in FIG. 18, the time to digital converter 1 in the second embodiment includes the state transition section 10, the transition-state acquiring section 20, and the arithmetic operation section 30.

n (n≥2) trigger signals TRG1 to TRGn are input to the state transition section 10. The state transition section 10 starts state transition according to each of the input trigger signals TRG1 to TRGn. In the second embodiment, time events of the trigger signals TRG1 to TRGn arise in this order at an interval of a predetermined time or more.

The transition-state acquiring section 20 acquires the propagation information D in synchronization with the rising edge of the reference clock signal CLK and holds the propagation information D as propagation information S. The transition-state acquiring section 20 acquires the count information q in synchronization with the rising edge of the reference clock signal CLK and holds the count information q as the count information Q. The propagation information S and the count information Q held by the transition-state acquiring section 20 are output to the arithmetic operation section 30.

Figure 19:
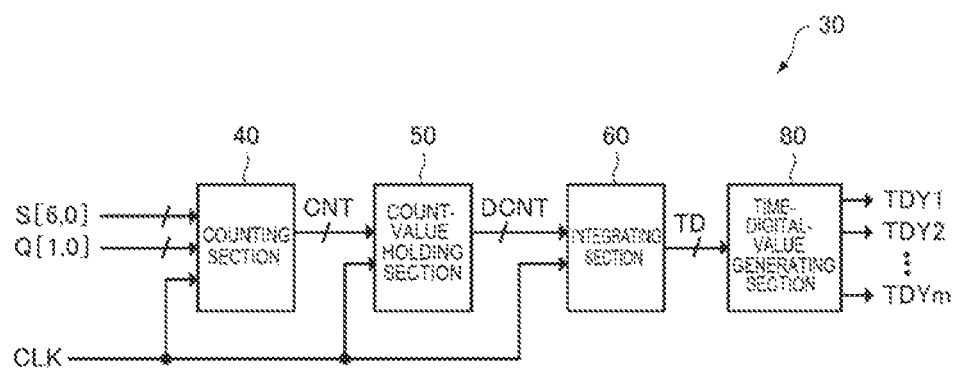
FIG. 19 is a diagram showing the configuration of an arithmetic operation section of the time to digital converter in the second embodiment.

FIG. 19 is a diagram showing the configuration of the arithmetic operation section 30 of the time to digital converter 1 in the second embodiment. As shown in FIG. 19, the arithmetic operation section 30 includes the counting section 40, the count-value holding section 50, the integrating section 60, and a time-digital-value generating section 80. The counting section 40 generates the weighted count value CNT based on the propagation information S and the count information Q output from the transition-state acquiring section 20. When a time event of a trigger signal TRGi (i is each of 1 to n−1) arises, the counting section 40 outputs the weighted count value CNT corresponding to the trigger signal TRGi. After the counting section 40 outputs the weighted count value CNT corresponding to the trigger signal TRGi, the weighted count value CNT held by the counting section 40 is initialized to "0". Thereafter, according to arising of a time event of a trigger signal TRGi+1, the counting section 40 outputs the weighted count value CNT corresponding to the trigger signal TRGi+1.

The count-value holding section 50 sequentially captures, in synchronization with the reference clock signal CLK, n weighted count values CNT output in order from the counting section 40 and holds the n weighted count value CNT as the weighted count values DCNT.

The integrating section 60 sequentially integrates, in synchronization with the reference clock signal CLK, the n weighted count value DCNT held in order by the count-value holding section 50 to generate, in order, n time digital values TD corresponding to time intervals between time events of the respective trigger signals TRG1 to TRGn and a time event of the reference clock signal CLK. The count-value holding section 50 and the integrating section 60 are initialized when, for example, a not-shown reset signal is input.

The time-digital-value generating section 80 generates, in synchronization with the reference clock signal CLK, based on the n time digital values TD corresponding to the trigger signals TRG1 to TRGn, the time digital values TDY1 to TDYm corresponding to a time interval between at least two time events of the trigger signals TRG1 to TRGn. In other words, the time to digital converter 1 generates a time digital value TDY corresponding to the time interval between the two time events from a difference between the time digital value TD corresponding to a time event of any one of the trigger signals TRG1 to TRGn and the time digital value TD corresponding to a time event of different any one of the trigger signals TRG1 to TRGn.

For example, m=n−1 and a time digital value TDYi (i is each of 1 to n−1) may be a difference between the time digital value TD corresponding to the trigger signal TRGi+1 and the time digital value TD corresponding to the trigger signal TRGi. Any one of the trigger signals TRG1 to TRGn is an example of a first trigger signal and the time digital value TD corresponding to the trigger signal is an example of a first time digital value. Different any one of the trigger signals TRG1 to TRGn is an example of a second trigger signal and the time digital value TD corresponding to the trigger signal is an example of a second time digital value. The time digital value TDY calculated from a difference between the time digital value TD corresponding to any one of the trigger signals TRG1 to TRGn and a time digital value TD corresponding to different any one of the trigger signals TRG1 to TRGn is an example of a time digital value in the second embodiment.

In this embodiment, a time event of the reference clock signal CLK is set independently from time events of the trigger signals TRG1 to TRGn. In other words, the time event of the reference clock signal CLK and the time events of the trigger signals TRG1 to TRGn are asynchronous.

Therefore, time digital values TD1 to TDn can be used as time stamps corresponding to time intervals among the time events of the trigger signals TRG1 to TRGn. The time digital values TDY1 to TDYm corresponding to a time interval between at least two time events of the trigger signals TRG1 to TRGn can be acquired using these time stamps.

The time-digital-value generating section 80 may perform predetermined scaling on the time digital values TDY1 to TDYm and output the time digital values TDY1 to TDYm or may convert the time digital values TDY1 to TDYm according to a predetermined conversion formula or table information and output the time digital values TDY1 to TDYm.

With the time to digital converter 1 in the second embodiment explained above, the same effects as the effects of the time to digital converter 1 in the first embodiment are achieved. With the time to digital converter 1 in the second embodiment, the counting section 40, the count-value holding section 50, and the integrating section 60 are used in common for the trigger signals TRG1 to TRGn to generate the time digital values TDY1 to TDYm. Therefore, the time to digital converter 1 can be reduced in size.

1.3 Third Embodiment

The time to digital converter 1 in a third embodiment generates, as in the second embodiment, the time digital values TDY1 to TDYm corresponding to at least two time intervals of time events of the plurality of trigger signals TRG. However, in the time to digital converter 1 in the third embodiment, a plurality of state transition sections 10 and a plurality of transition-state acquiring sections 20 are used.

Figure 20:
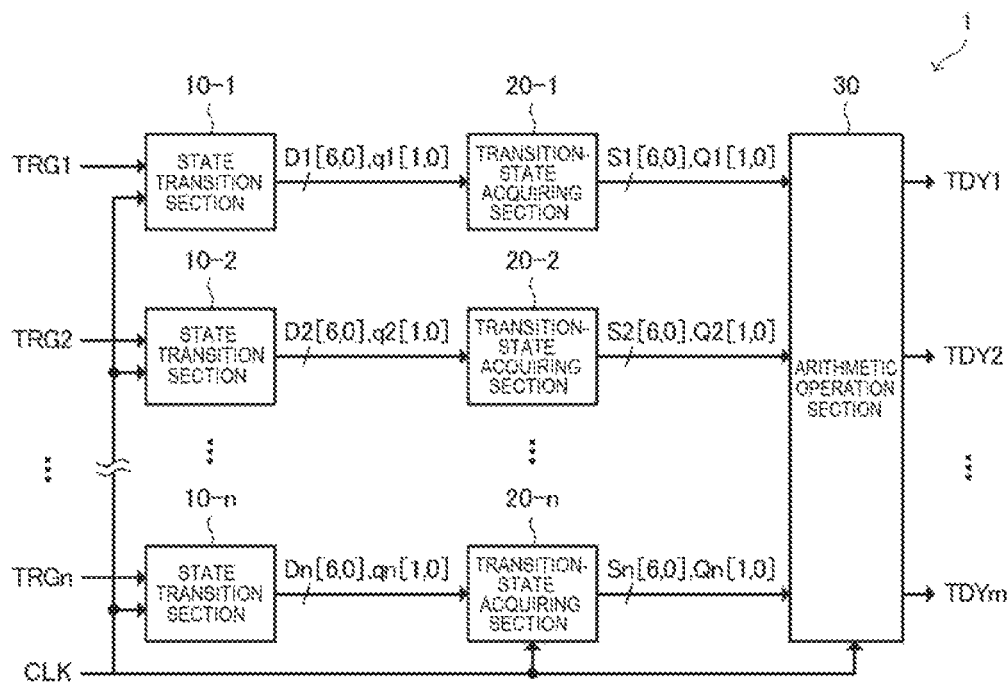
FIG. 20 is a diagram showing a time to digital converter in a third embodiment.

FIG. 20 is a diagram showing the configuration of the time to digital converter 1 in the third embodiment. As shown in FIG. 20, the time to digital converter 1 in the third embodiment includes n (n2) state transition sections 10-1 to 10-n, n transition-state acquiring sections 20-1 to 20-n, and the arithmetic operation section 30.

The n trigger signals TRG1 to TRGn are respectively input to the n state transition sections 10-1 to 10-n. The respective state transition sections 10-1 to 10-n start state transition according to the respective input trigger signals TRG1 to TRGn.

The respective transition-state acquiring sections 20-1 to 20-n acquire, in synchronization with the rising edge of the reference clock signal CLK, propagation information D1[6, 0] to Dn[6, 0] output from the respective state transition sections 10-1 to 10-n and hold the propagation information D1[6, 0] to Dn[6, 0] as propagation information S1[6, 0] to Sn[6, 0]. The respective transition-state acquiring sections 20-1 to 20-n acquire, in synchronization with the rising edge of the reference clock signal CLK, count information q1[1, 0] to qn[1, 0] output from the respective state transition sections 10-1 to 10-n and hold the count information q1[1, 0] to qn[1, 0] as count information Q1[1, 0] to Qn[1, 0]. The propagation information S1[6, 0] to Sn[6, 0] and the count information Q1[1, 0] to Qn[1, 0] respectively held by the transition-state acquiring sections 20-1 to 20-n are output to the arithmetic operation section 30.

Figure 21:
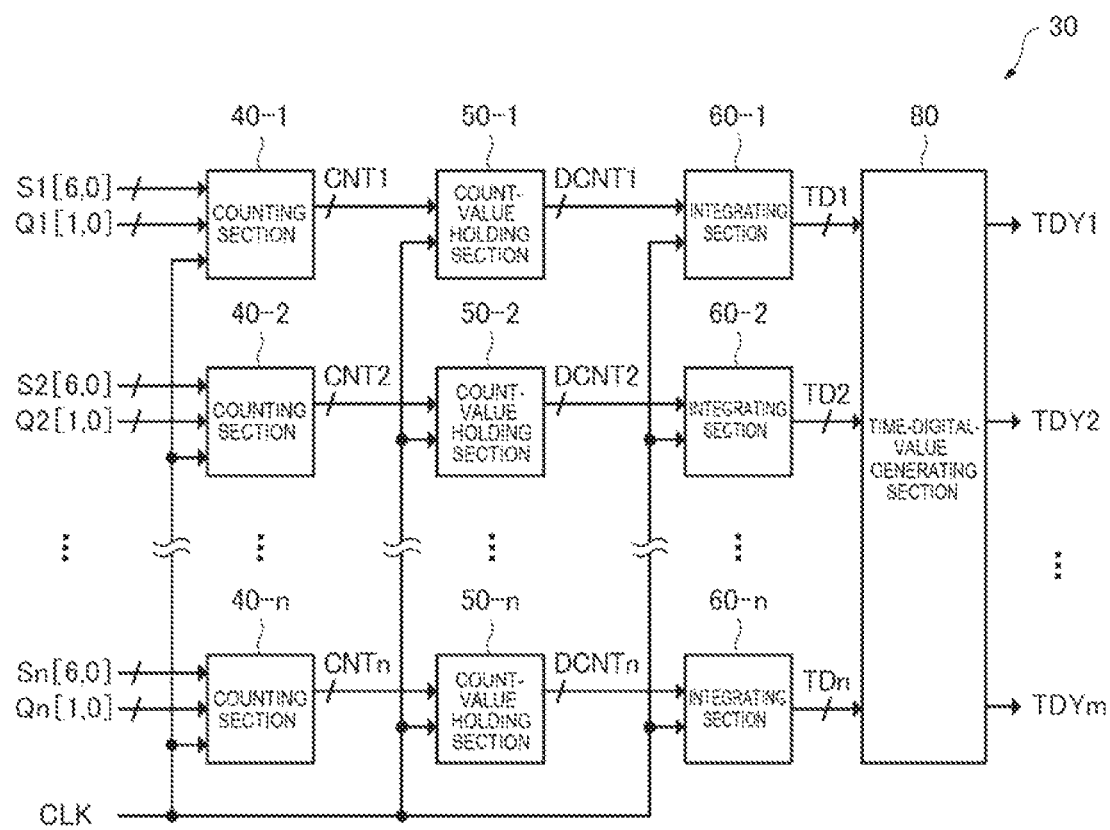
FIG. 21 is a diagram showing the configuration of an arithmetic operation section of the time to digital converter in the third embodiment.

FIG. 21 is a diagram showing the configuration of the arithmetic operation section 30 of the time to digital converter 1 in the third embodiment. As shown in FIG. 21, the arithmetic operation section 30 includes n counting sections 40-1 to 40-n, n count-value holding sections 50-1 to 50-n, n integrating sections 60-1 to 60-n, and the time-digital-value generating section 80.

The respective counting sections 40-1 to 40-n generate weighted count values CNT1 to CNTn based on the propagation information S1[6, 0] to Sn[6, 0] and the count information Q[1, 0] to Qn[1, 0] output from the respective transition-state acquiring sections 20-1 to 20-n.

The count-value holding sections 50-1 to 50-n capture, in synchronization with the reference clock signal CLK, the weighted count values CNT1 to CNTn output from the respective transition-state acquiring sections 20-1 to 20-n and hold the weighted count values CNT1 to CNTn as weighted count values DCNT1 to DCNTn. The count-value holding sections 50-1 to 50-n are initialized to "0" when a not-shown reset signal is input.

The integrating sections 60-1 to 60-n integrate, in synchronization with the reference clock signal CLK, the respective weighted count values DCNT1 to DCNTn held by the count-value holding sections 50-1 to 50-n and generate n time digital values TD1 to TDn corresponding to time intervals between time events of the respective trigger signals TRG1 to TRGn and a time event of the reference clock signal CLK. The integrating sections 60-1 to 60-n are initialized to "0" by a not-shown reset signal.

The time-digital-value generating section 80 generates, in synchronization with the reference clock signal CLK, based on the time digital values TD1 to TDn generated by the integrating sections 60-1 to 60-n, the time digital values TDY1 to TDYm corresponding to a time interval between at least two time events of the trigger signals TRG1 to TRGn. For example, m=n−1 and the time digital value TDYi (i is each of 1 to n−1) may be a difference between a time digital value TDi+1 and a time digital value TDi. In other words, the time digital value TDYi may correspond to a time interval between a time event of the trigger signal TRGi and a time event of the trigger signal TRGi+1.

In this embodiment, a time event of the reference clock signal CLK is set independently from time events of the trigger signals TRG1 to TRGn. In other words, the time event of the reference clock signal CLK and the time events of the trigger signals TRG1 to TRGn are asynchronous.

Therefore, the time digital values TD1 to TDn can be used as time stamps corresponding to time intervals among the time events of the trigger signals TRG1 to TRGn. The time digital values TDY1 to TDYm corresponding to a time interval between at least two time events of the trigger signals TRG1 to TRGn can be acquired using these time stamps.

The time-digital-value generating section 80 may perform predetermined scaling on the time digital values TDY1 to TDYm and output the time digital values TDY1 to TDYm or may convert the time digital values TDY1 to TDYm according to a predetermined conversion formula or table information and output the time digital values TDY1 to TDYm.

With the time to digital converter 1 in the third embodiment explained above, the same effects as the effects of the time to digital converter 1 in the first embodiment are achieved.

In the time to digital converter 1 in the third embodiment, the state transition sections 10-1 to 10-n, the transition-state acquiring sections 20-1 to 20-n, the count-value holding sections 50-1 to 50-n, and the integrating sections 60-1 to 60-n operate in parallel with respect to the trigger signals TRG1 to TRGn. Therefore, the time digital values TDY1 to TDYm can be generated even when a time interval at which the time events of the trigger signals TRG1 to TRGn arise is short.

2. A/D Conversion Circuit 2.1 First Embodiment

Figure 22:
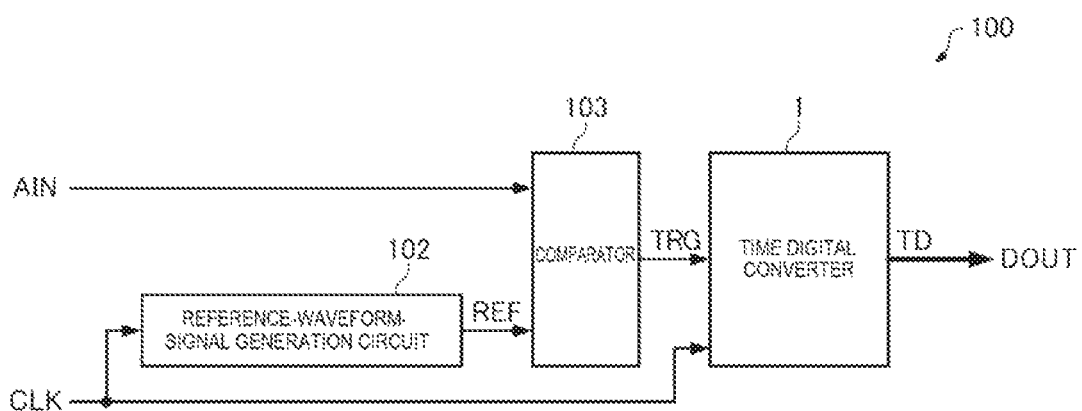
FIG. 22 is a diagram showing the configuration of an A/D conversion circuit in the first embodiment.

An A/D conversion circuit including the time to digital converter 1 is explained. FIG. 22 is a diagram showing the configuration of an A/D conversion circuit 100 in the first embodiment. As shown in FIG. 22, the A/D conversion circuit 100 in the first embodiment includes a reference-waveform-signal generation circuit 102, a comparator 103, and the time to digital converter 1. The A/D conversion circuit 100 converts an input analog signal AIN into a digital signal DOUT and outputs the digital signal DOUT.

The reference-waveform-signal generation circuit 102 generates a reference waveform signal REF based on the reference clock signal CLK. The reference waveform signal REF is a signal, a voltage of which changes in the same cycle as the cycle of the reference clock signal CLK. The reference waveform signal REF may be, for example, a triangular wave signal, a ramp wave signal, a sine wave signal, or a cosine wave signal. The reference-waveform-signal generation circuit 102 may generate the reference waveform signal REF based on a signal obtained by dividing the reference clock signal CLK. In this case, the reference waveform signal REF may be a signal, a voltage of which changes in a cycle obtained by dividing the reference clock signal CLK. Since the reference waveform signal REF is generated based on the signal obtained by dividing the reference clock signal CLK, clocking accuracy in the time to digital converter 1 is improved. As a result, accuracy and resolution of A/D conversion are improved.

The comparator 103 compares a voltage of the analog signal AIN and a voltage of the reference waveform signal REF generated by the reference-waveform-signal generation circuit 102 and outputs the trigger signal TRG.

The time to digital converter 1 outputs the time digital value TD corresponding to a time interval between a time event of the trigger signal TRG and a time event of the reference clock signal CLK.

The A/D conversion circuit 100 outputs the digital signal DOUT based on the time digital value TD. For example, the A/D conversion circuit 100 may output the time digital value TD as the digital signal DOUT having the time digital value TD or may convert the time digital value TD into the digital signal DOUT having a value linearly changing with respect to the voltage of the analog signal AIN and output the digital signal DOUT.

Figure 23:
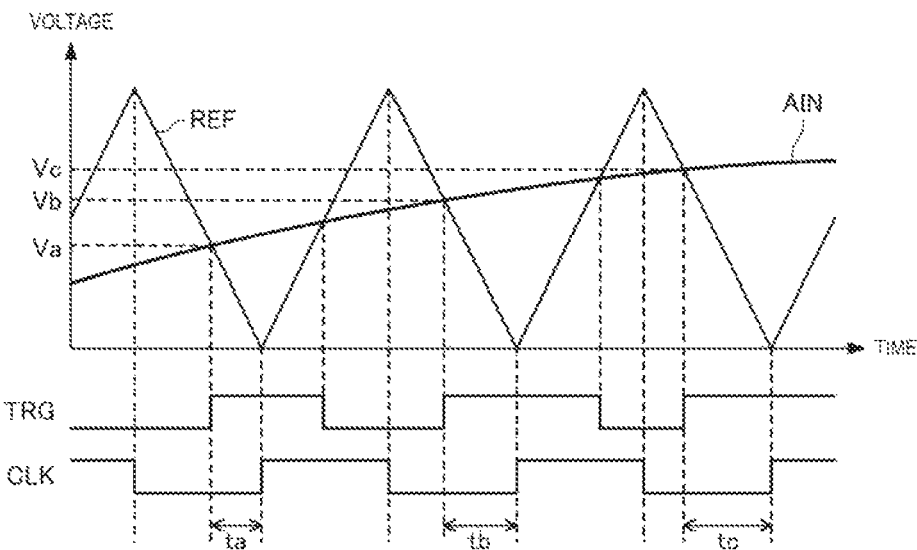
FIG. 23 is a diagram showing an example of waveforms of various signals in the A/D converter in the first embodiment.

FIG. 23 is a diagram showing an example of waveforms of various signals in the A/D conversion circuit 100 in the first embodiment. In the example shown in FIG. 23, the reference waveform signal REF is a triangular wave signal having the lowest voltage at the rising edge of the reference clock signal CLK and having the highest voltage at the falling edge of the reference clock signal CLK. The trigger signal TRG is at the high level if the voltage of the analog signal AIN is higher than the voltage of the reference waveform signal REF and is at the low level if the voltage of the analog signal AIN is lower than the voltage of the reference waveform signal REF.

In the example shown in FIG. 23, time intervals between the rising edges of the trigger signal TRG and the rising edges of the reference clock signal CLK at the time when the value of the voltage of the analog signal AIN are Va, Vb, and Vc are respectively ta, tb, and tc. The time intervals are ta<tb<tc with respect to Va<Vb<Vc. A time interval between the rising edge of the trigger signal TRG and the rising edge of the reference clock signal CLK linearly changes with respect to the voltage of the analog signal AIN. Therefore, the A/D conversion circuit 100 can output the level of the analog signal AIN as the digital signal DOUT having the time digital values TD corresponding to ta, tb, and tc.

With the A/D conversion circuit 100 in the first embodiment, high accuracy, high resolution, high-speed processing, low power consumption, a reduction in size, and the like can be realized by using the time to digital converter 1.

Figure 24:
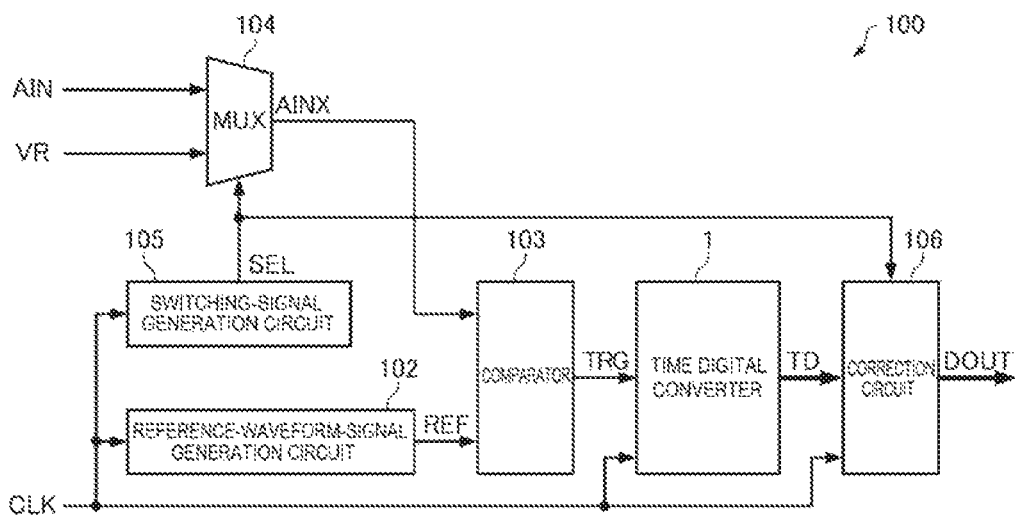
FIG. 24 is a diagram showing an A/D conversion circuit in a modification of the first embodiment.

FIG. 24 is a diagram showing the A/D conversion circuit 100 in a modification of the first embodiment. In the A/D conversion circuit 100 shown in FIG. 24, a calibration function is added to the A/D conversion circuit 100 shown in FIG. 22. In FIG. 24, the same components as the components shown in FIG. 22 are denoted by the same reference numerals and signs. Explanation of the components is omitted.

The A/D conversion circuit 100 shown in FIG. 24 includes the reference-waveform-signal generation circuit 102, the comparator 103, and the time to digital converter 1 and further includes a multiplexer 104, a switching-signal generation circuit 105, and a correction circuit 106.

The multiplexer 104 selects the analog signal AIN when a switching signal SEL is at the low level, selects the reference voltage VR when the switching signal SEL is at the high level, and outputs the selected analog signal AIN or the selected reference voltage VR as an analog signal AINX. The reference voltage VR is a predetermined constant voltage.

The switching-signal generation circuit 105 generates the switching signal SEL in synchronization with the reference clock signal CLK. For example, the switching-signal generation circuit 105 changes the switching signal SEL from the low level to the high level immediately before the A/D conversion circuit 100 starts A/D conversion processing or periodically and changes the switching signal SEL from the high level to the low level after a predetermined time elapses.

The analog signal AINX output from the multiplexer 104 is input to the comparator 103 and converted into the time digital value TD by the reference-waveform-signal generation circuit 102, the comparator 103, and the time to digital converter 1.

When the switching signal SEL is at the high level, the correction circuit 106 calculates, in synchronization with the reference clock signal CLK, a difference between a reference value and the time digital value TD generated with respect to the reference voltage VR and stores the difference in a not-shown register as a correction value. When the switching signal SEL is at the low level, the correction circuit 106 corrects, using the correction value stored in the register, the time digital value TD generated with respect to the analog signal AIN and generates the digital signal DOUT.

With the A/D conversion circuit 100 in the modification of the first embodiment, it is possible to correct the influences of a temperature change, a power supply voltage change, a change over time, and the like by executing calibration using the reference voltage VR. Therefore, it is possible to highly accurately perform A/D conversion.

2.2 Second Embodiment

Figure 25:
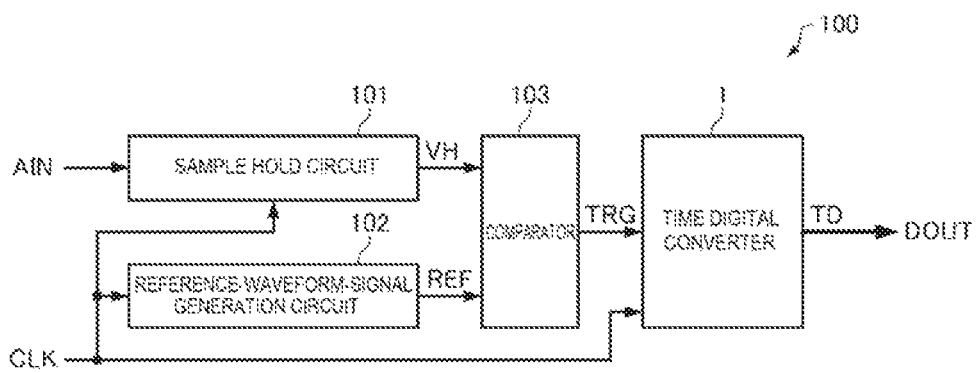
FIG. 25 is a diagram showing the configuration of an A/D conversion circuit in the second embodiment.

FIG. 25 is a diagram showing the configuration of the A/D conversion circuit 100 in the second embodiment. As shown in FIG. 25, the A/D conversion circuit 100 in the second embodiment includes a sample hold circuit 101, the reference-waveform-signal generation circuit 102, the comparator 103, and the time to digital converter 1. The A/D conversion circuit 100 in the second embodiment converts the input analog signal AIN into the digital signal DOUT and outputs the digital signal DOUT.

The sample hold circuit 101 samples and holds the voltage of the analog signal AIN in synchronization with the reference clock signal CLK.

The reference-waveform-signal generation circuit 102 generates the reference waveform signal REF based on the reference clock signal CLK. The reference waveform signal REF is a signal, a voltage of which changes in the same cycle as the cycle of the reference clock signal CLK. The reference waveform signal REF may be, for example, a triangular wave signal, a ramp wave signal, a sine wave signal, or a cosine wave signal. The reference-waveform-signal generation circuit 102 may generate the reference waveform signal REF based on a signal obtained by dividing the reference clock signal CLK. In this case, the reference waveform signal REF may be a signal, a voltage of which changes in a cycle obtained by dividing the reference clock signal CLK. Since the reference waveform signal REF is generated based on the signal obtained by dividing the reference clock signal CLK, clocking accuracy in the time to digital converter 1 is improved. As a result, accuracy and resolution of A/D conversion are improved.

The comparator 103 compares a voltage VH held by the sample hold circuit 101 and a voltage of the reference waveform signal REF generated by the reference-waveform-signal generation circuit 102 and outputs the trigger signal TRG.

The time to digital converter 1 outputs the time digital value TD corresponding to a time interval between a time event of the trigger signal TRG and a time event of the reference clock signal CLK.

The A/D conversion circuit 100 outputs the digital signal DOUT based on the time digital value TD. For example, the A/D conversion circuit 100 may output the time digital value TD as the digital signal DOUT having the time digital value TD or may convert the time digital value TD into the digital signal DOUT having a value linearly changing with respect to the voltage of the analog signal AIN and output the digital signal DOUT.

Figure 26:
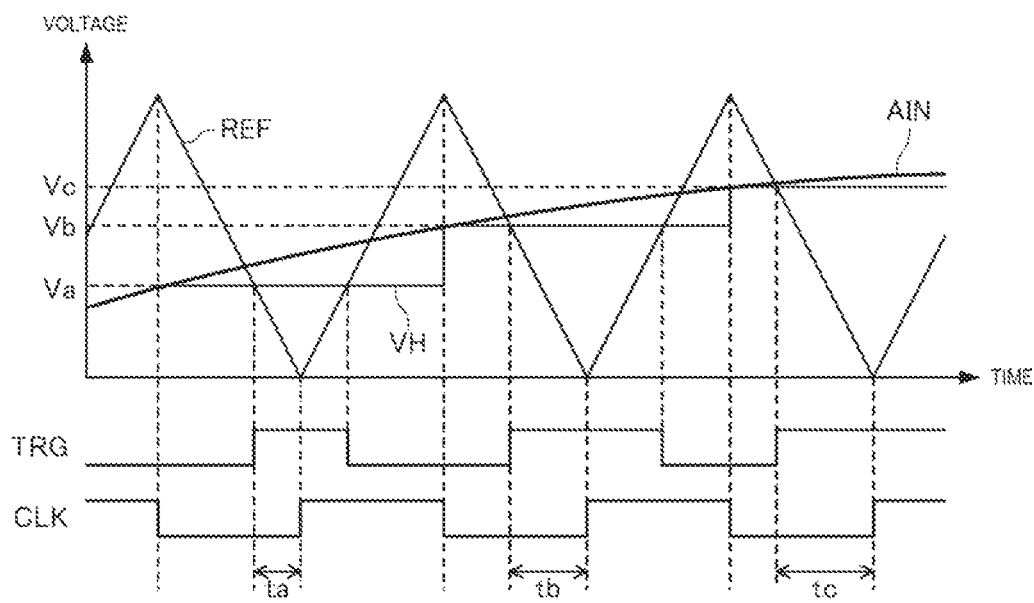
FIG. 26 is a diagram showing an example of waveforms of various signals in the A/D conversion circuit in the second embodiment.

FIG. 26 is a diagram showing an example of waveforms of various signals in the A/D conversion circuit 100 in the second embodiment. In the example shown in FIG. 26, a voltage of the analog signal AIN is sampled and held at each rising edge of the reference clock signal CLK. The reference waveform signal REF is a triangular wave signal having the lowest voltage at the rising edge of the reference clock signal CLK and having the highest voltage at the falling edge of the reference clock signal CLK. The trigger signal TRG is at the high level if the voltage VH is higher than the voltage of the reference waveform signal REF and is at the low level if the voltage VH is lower than the voltage of the reference waveform signal REF.

In the example shown in FIG. 26, when values of the voltage VH, in which the voltage of the analog signal AIN is held, are Va, Vb, and Vc, time intervals between the rising edges of the trigger signal TRG and the rising edges of the reference clock signal CLK are respectively ta, tb, and tc. The time intervals are ta<tb<tc with respect to Va<Vb<Vc. A time interval between the rising edge of the trigger signal TRG and the rising edge of the reference clock signal CLK linearly changes with respect to the voltage of the analog signal AIN. Therefore, the A/D conversion circuit 100 can output the analog signal AIN as the digital signal DOUT having the time digital values TD corresponding to ta, tb, and tc.

With the A/D conversion circuit 100 in the second embodiment, high accuracy, high resolution, high-speed processing, low power consumption, a reduction in size, and the like can be realized by using the time to digital converter 1. Since sample timing can be kept constant by the sample hold circuit 101, it is possible to reduce jitter of A/D conversion timing.

Figure 27:
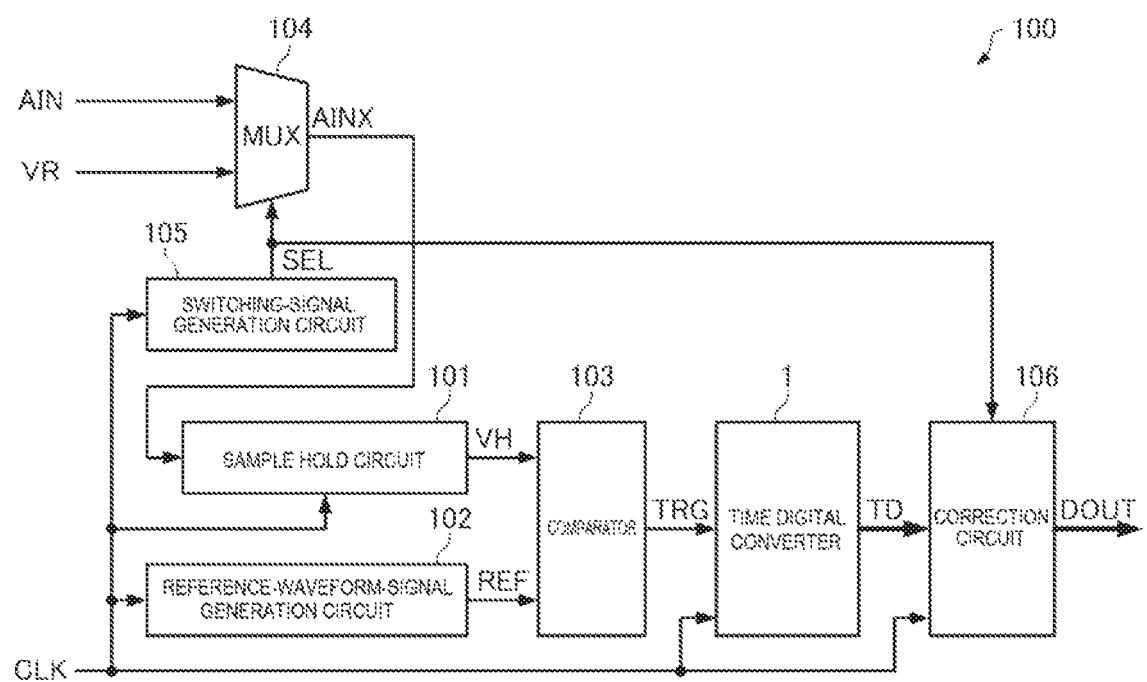
FIG. 27 is a diagram showing an A/D conversion circuit in a modification of the second embodiment.

FIG. 27 is a diagram showing the A/D conversion circuit 100 in a modification of the second embodiment. In the A/D conversion circuit 100 shown in FIG. 27, a calibration function is added to the A/D conversion circuit 100 shown in FIG. 25. In FIG. 27, the same components as the components shown in FIG. 24 are denoted by the same reference numerals and signs. Explanation of the components is omitted.

The A/D conversion circuit 100 shown in FIG. 27 includes the sample hold circuit 101, the reference-waveform-signal generation circuit 102, the comparator 103, and the time to digital converter 1 and further includes the multiplexer 104, the switching-signal generation circuit 105, and the correction circuit 106.

The multiplexer 104 selects the analog signal AIN when the switching signal SEL is at the low level, selects the reference voltage VR when the switching signal SEL is at the high level, and outputs the selected analog signal AIN or the selected reference voltage VR as the analog signal AINX. The reference voltage VR is a predetermined constant voltage.

The switching-signal generation circuit 105 generates the switching signal SEL in synchronization with the reference clock signal CLK. For example, the switching-signal generation circuit 105 changes the switching signal SEL from the low level to the high level immediately before the A/D conversion circuit 100 starts the A/D conversion processing or periodically and changes the switching signal SEL from the high level to the low level after a predetermined time elapses.

The analog signal AINX output from the multiplexer 104 is input to the sample hold circuit 101 and converted into the time digital value TD by the sample hold circuit 101, the reference-waveform-signal generation circuit 102, the comparator 103, and the time to digital converter 1.

When the switching signal SEL is at the high level, the correction circuit 106 calculates, in synchronization with the reference clock signal CLK, a difference between a reference value and the time digital value TD generated with respect to the reference voltage VR and stores the difference in a not-shown register as a correction value. When the switching signal SEL is at the low level, the correction circuit 106 corrects, using the correction value stored in the register, the time digital value TD generated with respect to the analog signal AIN and generates the digital signal DOUT.

With the A/D conversion circuit 100 in the modification of the second embodiment, it is possible to correct the influences of a temperature change, a power supply voltage change, a change over time, and the like by executing calibration using the reference voltage VR. Therefore, it is possible to highly accurately perform A/D conversion. Since sample timing can be kept constant by the sample hold circuit 101, it is possible to reduce jitter of A/D conversion timing.

The embodiments and the modifications are explained above. However, the present disclosure is not limited to the embodiments and can be implemented in various forms in a range not departing from the gist of the present disclosure. For example, the embodiments can also be combined as appropriate.

The present disclosure includes components substantially the same as the components explained in the embodiments (for example, components having the same functions, methods, and results or components having the same objects and effects). The present disclosure includes components obtained by replacing unessential portions of the components explained in the embodiments. The present disclosure includes components that achieve the same action effects as the action effects of the components explained in the embodiments or components that can achieve the same objects as the objects of the components explained in the embodiments. The present disclosure includes components obtained by adding publicly-known techniques to the components explained in the embodiments.

What is claimed is:

1. A time to digital converter to which a reference signal and a trigger signal are input, the time to digital converter outputting a time digital value corresponding to a time event of the trigger signal, the time to digital converter comprising:
   a state transition section configured to output state information indicating an internal state and start, based on the trigger signal, state transition in which the internal state transitions;
   a transition-state acquiring section configured to acquire, in synchronization with the reference signal, the state information from the state transition section and hold the state information; and
   an arithmetic operation section configured to calculate, based on the state information, the time digital value corresponding to a number of times of transition of the internal state, wherein
   the state transition section includes a tapped delay line to which a plurality of delay elements are coupled, a logic circuit, and a state machine, the state information is represented by count information output from the state machine and propagation information output from the tapped delay line, a hamming distance of the state information before and after the state transition is 1, and a time from when the internal state transitions from a first internal state to a second internal state until when the internal state reverts to the first internal state is longer than a time interval for updating the state information held by the transition-state acquiring section.

2. The time to digital converter according to claim 1, wherein the state transition section stops the state transition when the number of times of transition exceeds a number of times based on an upper limit value.

3. The time to digital converter according to claim 1, wherein the arithmetic operation section calculates a number of times of state transition based on the state information, weights the number of times of state transition based on elapse of time, and integrates the weighted number of times of state transition to calculate and output the time digital value.

4. The time to digital converter according to claim 3, wherein the arithmetic operation section corrects the number of times of state transition using a delay amount of each of the plurality of delay elements.

5. The time to digital converter according to claim 1, wherein a plurality of the trigger signals are input, and the arithmetic operation section generates the time digital value from a difference between a first time digital value corresponding to a time event of a first trigger signal among the plurality of trigger signals and a second time digital value corresponding to a time event of a second trigger signal among the plurality of trigger signals.

6. An A/D conversion circuit that converts an input analog signal into a digital signal and outputs the digital signal, the A/D conversion circuit comprising:

the time to digital converter according to claim 1;

a reference-waveform-signal generation circuit configured to generate a reference waveform signal based on the reference signal; and a comparator configured to compare a voltage of the analog signal and a voltage of the reference waveform signal and output the trigger signal, wherein the A/D conversion circuit outputs the digital signal based on the time digital value generated by the time to digital converter.

7. An A/D conversion circuit that converts an input analog signal into a digital signal and outputs the digital signal, the A/D conversion circuit comprising:

the time to digital converter according to claim 1;

a sample hold circuit configured to sample and hold a voltage of the analog signal;

a reference-waveform-signal generation circuit configured to generate a reference waveform signal based on the reference signal; and a comparator configured to compare the voltage held by the sample hold circuit and a voltage of the reference waveform signal and output the trigger signal, wherein the A/D conversion circuit outputs the digital signal based on the time digital value generated by the time to digital converter.

* * * * *